US00RE35952E

United States Patent [19]

Beery

[11] E Patent Number: Re. 35,952

[45] **Reissued Date of Patent: *Nov. 10, 1998**

[54] TELEVISION RECEIVER HAVING MEMORY CONTROL FOR TUNE-BY-LABEL FEATURE

[76] Inventor: Jack Beery, 907 Sixth St., S.W., Suite 815-C, Washington, D.C. 20024

[ * ] Notice: The term of this patent shall not extend beyond the expiration date of Pat. No. 5,068,734.

[21] Appl. No.: 116,019

[22] Filed: Sep. 2, 1993

Related U.S. Patent Documents

Reissue of:

[64] Patent No.: 5,045,947
Issued: Sep. 3, 1991
Appl. No.: 514,693
Filed: Apr. 26, 1990

U.S. Applications:

[63] Continuation-in-part of Ser. No. 359,155, May 31, 1989, Pat. No. 5,068,734.

[51] Int. Cl.[6] ..... H04N 5/50

[52] U.S. Cl. ..... 348/731; 348/570; 348/734

[58] Field of Search ..... 347/731, 734; 348/732, 570; 455/186.1, 158.5, 352; H04N 5/76, 5/50

[56] References Cited

U.S. PATENT DOCUMENTS

| | | | |
|---|---|---|---|
| 3,976,995 | 8/1976 | Sebestyen | 340/337 |
| 4,123,713 | 10/1978 | Wine | 325/455 |
| 4,187,469 | 2/1980 | Tanaka | 325/464 |
| 4,228,541 | 10/1980 | Snedkerud et al. | 455/158 |
| 4,228,543 | 10/1980 | Jackson | 455/181 |

(List continued on next page.)

FOREIGN PATENT DOCUMENTS

| | | | |
|---|---|---|---|
| 0 209 703 A1 | 4/1987 | European Pat. Off. . | |
| 0 424 725 A2 | 5/1991 | European Pat. Off. | H04N 5/782 |
| OS 26 12 260 | 9/1977 | Germany | H04N 5/44 |
| 25 42 021 B2 | 10/1977 | Germany | H03J 1/06 |
| 36 28 964 A1 | 3/1988 | Germany | H03J 5/00 |
| 36 40 437 A1 | 6/1988 | Germany | H03J 5/00 |
| 58-13082 | 1/1983 | Japan . | |
| 58-172011 | 10/1983 | Japan | H03J 5/00 |
| 61-61577 | 3/1986 | Japan | H04N 5/445 |
| 63-36608 | 2/1988 | Japan | H04N 5/44 |
| 63-59075 | 3/1988 | Japan . | |
| 2 021 887 | 12/1979 | United Kingdom | H03J 3/18 |
| 2 083 722 | 3/1982 | United Kingdom | H03J 1/02 |
| 2 104 277 | 3/1983 | United Kingdom . | |
| 2 126 002 | 3/1984 | United Kingdom . | |
| WO 90/07844 | 7/1990 | WIPO | H04N 5/782 |
| WO 92/04801 | 3/1992 | WIPO | H04N 5/76 |
| WO 93/07711 | 4/1993 | WIPO | H04N 5/76 |
| WO 93/12612 | 6/1993 | WIPO | H04N 5/76 |

OTHER PUBLICATIONS

Eitz et al., "Videotext programmiert Videoheimgeräte [Video Text Programs Video Devices in the Home]," *Rundfunktechn. Mitteilungen*, vol. 30 (1986).

"MOS Chip in Remote–control Unit Helps Tune TV Set Electronically," *Electronics*, Jun. 27, 1974, pp. 34–35.

(List continued on next page.)

*Primary Examiner*—Nathan J. Flynn

[57] ABSTRACT

A television control system is for selecting a television channel corresponding to a preassigned channel tuning designation. A tuner receives multi-channel input signal, and in response to a processor signal, tunes out all but one selected channel. A memory stores at least one operator-assigned channel select designation for the channel tuning designations. An operator-actuated control means generates a first data signal representative of a desired channel select designation for one of the channel tuning designations, and a second data signal representative of a desired viewing channel identified by one of the channel select designations. A processor receives the first data signal from the control means, and in response, causes the memory to store the desired channel select designation as corresponding to the tuning designation. Upon receipt of the second data signal, the processor retrieves from the memory the channel tuning designation corresponding to the channel select designation, and generates the processor signal to correspond to the channel tuning designation.

53 Claims, 9 Drawing Sheets

U.S. PATENT DOCUMENTS

| | | | |
|---|---|---|---|
| 4,232,396 | 11/1980 | Grimes | 455/179 |
| 4,261,055 | 4/1981 | Farina | 455/158 |
| 4,270,145 | 5/1981 | Farina | 358/188 |
| 4,279,035 | 7/1981 | Skerlos | 455/158 |
| 4,313,213 | 1/1982 | Farina et al. | 455/158 |
| 4,314,375 | 2/1982 | Belisomi | 455/158 |
| 4,317,213 | 2/1982 | DiLorenzo | 455/1 |
| 4,317,225 | 2/1982 | Henderson et al. | 455/158 |
| 4,352,202 | 9/1982 | Carney | 455/151 |
| 4,355,415 | 10/1982 | George et al. | 455/185 |
| 4,355,416 | 10/1982 | Malerba | 455/186 |
| 4,361,907 | 11/1982 | Wine | 455/160 |
| 4,375,651 | 3/1983 | Templin | 358/191.1 |
| 4,392,246 | 7/1983 | Niioka et al. | 455/158 |
| 4,419,769 | 12/1983 | Cohen | 455/182 |
| 4,425,579 | 1/1984 | Merrell | 358/86 |
| 4,495,654 | 1/1985 | Deiss | 455/151 |
| 4,510,623 | 4/1985 | Bonneau et al. | 455/181 |
| 4,521,914 | 6/1985 | Petrovic | 455/158 |
| 4,527,194 | 7/1985 | Sirazi | 358/86 |
| 4,559,561 | 12/1985 | Amano et al. | 358/192.1 |
| 4,600,918 | 7/1986 | Belisomi et al. | 340/711 |
| 4,620,229 | 10/1986 | Amano et al. | 358/194.1 |
| 4,626,848 | 12/1986 | Ehlers | 340/825.69 |
| 4,644,349 | 2/1987 | Fujita et al. | 340/825.25 |
| 4,686,564 | 8/1987 | Masuko et al. | 358/86 |
| 4,706,121 | 11/1987 | Young | 358/142 |
| 4,718,107 | 1/1988 | Hayes | 455/4 |
| 4,751,578 | 6/1988 | Reiter et al. | 358/183 |
| 4,763,195 | 8/1988 | Tults | 358/193.1 |
| 4,870,492 | 9/1989 | Hakamada et al. | 358/193.1 |
| 4,885,579 | 12/1989 | Sandbank | 340/825.72 |
| 4,897,714 | 1/1990 | Christis | 358/86 |
| 4,907,085 | 3/1990 | Bingham | 358/181 |
| 4,912,463 | 3/1990 | Li | 340/825.69 |
| 4,914,428 | 4/1990 | Kobayashi | 340/825.62 |
| 4,914,517 | 4/1990 | Duffield | 358/191.1 |
| 4,959,720 | 9/1990 | Duffield et al. | 358/191.1 |
| 4,977,455 | 12/1990 | Young | 358/142 |
| 4,998,292 | 3/1991 | Eigeldinger et al. | 455/186 |
| 4,999,622 | 3/1991 | Amano et al. | 340/825.72 |
| 5,151,789 | 9/1992 | Young | 358/194.1 |
| 5,307,173 | 4/1994 | Yuen et al. | 358/335 |

OTHER PUBLICATIONS

Steckler, "STAR—New Kind of TV Remote Control," *Radio–Electronics*, Dec. 1974, pp. 44–50.

"Digital ICs Think for TV Tuners," *Electronics*, Jun. 19, 1975, p. 38.

Walker, "For TV Tuners, a Digital Look," *Electronics*, Jun. 26, 1975, pp. 65–66.

Wilson, "New Digital Remote Control," *Remote–Electronics*, Jan. 1976, pp. 58–60, 86–87.

Penner, "Digital Television Tuner Uses MOS LSI and Nonvolatile Memory," *Electronics*, Apr. 1, 1976, pp. 86–90.

Kleiman, "HEATHKIT GR–2001—Programmable Color TV," *Radio–Electronics*, May 1977, pp. 49–51, 93.

Philips, Technical Information 024, "DICS Digital Tuning System for TV Receivers," release date Feb. 7, 1977.

RCA "Dimensia" Color Television Owner's Manual, copyr. 1987 (excerpts).

Baer, "Tele–briefs, A Novel User–Selectable Real Time News Headline Service for Cable TV," *IEEE Trans. on Consumer Electronics*, Vol. CE–25, No. 3, Jul. 1979.

d'Andrea et al., "Frequency Synthesis for Color TV–Receivers with a New Dedicated Micro–Computer," *IEEE Trans. on Consumer Electronics*, vol. CE–27, No. 3, Aug. 1981.

"Video Programm System: Flexibel programmieren mit VPS [Video Program System: Flexible Programming with VPS]," *Funkschau*, vol. 25, pp. 47–51, 1985.

Operating Guide for Hitachi TV Model CT–2079B.

Operating Guide for Hitachi TV Model CT–1938.

Instruction Manual for Hitachi videorecorder Model VT–1800A (excerpts).

Instruction Manual for Hitachi videorecorder Model VT–2500A (excerpts).

Instruction Manual for JVS TVs Models C–2018/C–2028/C–2038.

Service Manual for JVC TV Model AV–2637S (Jun. 1987).

Service Manual for JVC TV Model C–2018 (Jan. 1988)(excerpts).

Service Manual for JVC TV Model C–2627 (Apr. 1987)(excerpts).

Operating Guide for Mitsubishi TV Model CF2670R.

Service Manual for Mitsubishi TV Model CF2670R.

Operations Manual for Jerrold "Starcom VI" Model DQN Digital Plain Converter.

Service Manual for Grundig TV Model CUC 2400 (excerpts).

Owner's Manual for RCA videocorder Model VR695HF (1988).

Customer Handbook Jerrold "Impulse 7000" Model DP71/DPV72/DPBB73 Addressable Converters (Jun. 1988).

Advertisement re Oak Communications "Sigma" Converters, *Communication Engineering and Design*, May 1987.

Advertisement re Hamlin Model CR–6600 Channel Convertor, *Cable Television Business*, Sep. 1, 1986.

Advertisement re Hamlin Model CRX 5000 Channel Convertor, *Cable Television Business*, Dec. 1, 1983.

Advertisement re Pioneer Model BC–4000 Channel Converter, *Cable Television Business*, Dec. 15, 1983.

Advertisement re Magnavox "Magna 6400" Digital Converter, *Cable Television Business*, Feb. 1, 1983.

Advertisement re Eagle Centronics CATV Converters, *Cable Television Business*, Oct. 1, 1983.

Advertisement re Jerrold Channel Converters: "Welcome to Jerrold's World of Impulse", *Cable Television Business*, May 15, 1987.

Advertisement re Jerrold "Starcom VI" Channel Converter, *Cable Television Business*, Dec. 15, 1986.

Advertisement re Scientific Atlanta "Series 8500" Channel Converter, *Cable Television Business*, Dec. 1, 1983.

Advertisement re Scientific Atlanta Models 8525, 6780 and 8530 Channel Converters, *Cable Television Business*, Jan. 1, 1986.

Advertisement re Panasonic Model VCS–1 Switcher, TZ–PC120 and TZ–PC150 Converters and PC200 Converter, *Communication Engineering and Design*, Mar. 1987.

Advertisement re Oak Communications "Sigma" Converters, *Cable Television Business*, Oct. 1, 1987.

Advertisement re Oak Communications "Sigma" Converters, *Cable Television Business*, Nov. 1, 1986.

"Experts Agree The TV of the future is here . . . in the Heathkit Digital–Design GR–2000 TV," magazine advertisement, source unknown, pp. 28–29.

"If you can use any of these tools . . . ," *Radio Electronics*, date unknown, pp. 46–47.

Page from article, *Radio Electronics*, date unknown, p. 50.

Pat. Abs. of Japan, vol. 12, No. 246 re JP–A–63 036 608, abstract published Jul. 12, 1988.

TELEVISION RECEIVER HAVING MEMORY CONTROL FOR TUNE-BY-LABEL FEATURE

Matter enclosed in heavy brackets [ ] appears in the original patent but forms no part of this reissue specification; matter printed in italics indicates the additions made by reissue.

RELATED APPLICATION

This is *a reissue of U.S. patent application Ser. No. 08/514,693, now U.S. Pat. No. 5,045,949, which is* a continuation in-part of U.S. patent application Ser. No. 359,155, filed May 31, 1989, *now U.S. Pat. No. 5,068,734.*

BACKGROUND OF THE INVENTION

The present invention relates generally to devices for viewer control of a television receiver and, more particularly, to such a control adapted especially for use with cable television service.

Historically, television channels have been identified by channel numbers, which numbers correspond both to a particular frequency with which the television signals are broadcast, and to a numerical designation on the controls of the television receiver. Specific channel numbers have been assigned to television broadcasting stations by governmental control agencies so as to minimize interference among the limited number of channels in use, typically by insuring adequate geographic separation between stations of the same channel number.

With the advent of cable television service in recent years, proper separation between different stations having the same channel number designation may no longer be possible. Certain stations which may broadcast on a particular numbered channel in their local area have become regionally or nationally distributed channels through cable service. Further, other channels have become available only on cable service, providing movie, sports and similar special programming. Such channels are typically not associated with any traditional channel number.

Because cable television service provides its channels on frequencies which are different from traditional over-the-air broadcasting, it has become common practice for cable subscribers to tune their television receivers to a desired channel using other than the normal tuning system. Even in the case of so-called "cable ready" receivers, the tuning band is different from that used in the absence of cable. Thus, cable service providers assign stations to channels available within the cable frequency band. These channels are numerical, like those for over-the-air broadcasting, although the total number of such channels may be different.

In general, cable providers assign over-the-air stations available on cable service to cable channels having the same numbers as the non-cable designation. For example, a channel "7" which may be received on the VHF broadcast band will be provided by the cable service on cable channel "7". However, it is not uncommon for more than one channel to be available on cable service having identical channel designations. For example, two stations may be available with both identified for over-the-air broadcasting as channel "17". Further, some cable channels are not available as over-the-air broadcasts in any locations. These channels may not have any numerical channel associated with them, but may be designated by a single word (e.g., "WEATHER," "NEWS," etc.), or by an acronym (e.g., "HBO," "ESPN," etc.).

As a result, cable service providers assign the various channels to numerical designations which may or may not correspond to the over-the-air channel designations with which the viewer is more likely to be familiar. A conversion chart must therefore be provided to the viewer, to enable him to locate the proper numerical designation for the desired channel. This can be awkward and inconvenient for the viewer, particularly in metropolitan areas having more than one cable service provider, or for travelers and others who may not be familiar with the local system.

A similar problem exists for television viewers who receive programming with a satellite receiver. Indeed, the tuning designations of the satellite receiver are even less likely to have some correspondence to the conventional, over-the-air channel designations of the desired programming.

What is needed, therefore, is a means by which cable and satellite television control devices may be made more convenient for the viewer. In particular, such means should enable control of television viewing using channel designations which match those with which the viewer is familiar, such as those published in a local newspaper, or other designations which are more meaningful to the viewer.

SUMMARY OF THE INVENTION

In meeting the foregoing needs, the present invention provides a television control system for selecting a television channel corresponding to a preassigned channel designation. Preferably, the channel designation represents a tuning designation. The system apparatus includes tuner means for inputing a processor signal and a multi-channel input signal, and in response to the processor signal, tuning out all but one channel corresponding to a selected one of the preassigned channel tuning designations. A memory means stores at least one operator-assigned channel select designation for at least one of the channel tuning designations. An operator-actuated control means generates a control output signal comprising one of (a) a first data signal representative of a desired channel select designation for one of the channel tuning designations, and (b) a second data signal representative of a desired viewing channel identified by an operator selected one of the channel select designations.

A processor means receives the control output signal from the operator-actuated control means, and upon receipt of the first data signal, causes the memory means to store the desired channel select designation as corresponding to the one channel tuning designation. Upon receipt of the second data signal, the processor means retrieves from the memory means the one of the channel tuning designations corresponding to the operator selected channel select designation, and generates the processor signal to correspond to the one channel tuning designation.

The operator actuated control means may include an alpha- and/or numeric keypad, with the control output signal comprising a string of alpha- and/or numeric characters generated in response to actuation of said keypad. A remote housing may be provided for mounting the keypad, along with means for transmitting the control output signal from the housing to the processor means. The transmitting means may include means for encoding the control signal as an infrared data stream, means for transmitting the infrared data stream, and means connected to the processor means for receiving the infrared data stream.

Alternatively, the remote housing may be for mounting the keypad, the processor means and the memory means, along with means for transmitting the processor signal from the housing to said tuner means.

In accordance with one embodiment of the present invention, the television control system includes the tuner means for receiving a processor signal and a multi-channel input signal, and in response to the processor signal, tuning out all but one channel corresponding to a selected one of the preassigned channel tuning designations. A memory means is provided for storing at least one operator-assigned channel select designation for at least one of the channel tuning designations. A first operator-actuated control means generates a first control output signal comprising a first data set representative of a desired channel select designation for one of the channel tuning designations. A second operator-actuated control means generates a second control output signal comprising a second data set representative of a desired viewing channel identified by an operator-selected one of the channel select designations.

A processor means receives the first and second control output signals from the first and second operator-actuated control means, and upon receipt of the first data set, causes the memory means to store the desired channel select designation as corresponding to the one channel tuning designation, and upon receipt of the second data set, retrieves from the memory means the one of the channel tuning designations corresponding to the operator selected channel select designation, and generates the processor signal to correspond to the one channel tuning designation.

The first control output signal comprises a first one of the channels of the multi-channel input signal. The processor means generates the processor signal to cause the tuner means to tune out all but the first one of the channels, and receives from the tuner means the first control output signal comprising the first of the channels.

This embodiment enables the control system to be programmed through the cable itself. In such a case, the first operator actuated control means is remote from the second operator actuated control means and, indeed, is located at the origin of the multi-channel signal.

In accordance with another embodiment of the invention, the television control system apparatus includes the tuner means for receiving a processor signal and a multi-channel input signal, and in response to the processor signal, tuning out all but one channel corresponding to a selected one of the preassigned channel tuning designations. A first memory means stores at least one operator-assigned channel select designation for at least one of the channel tuning designations. A second memory means also stores the operator-assigned channel select designations for the channel tuning designations.

A first operator-actuated control means generates a first control output signal comprising a first data set representative of a desired channel select designation for one of the channel tuning designations and generates a dump control output signal. A second operator-actuated control means generates a second control output signal comprising a second data set representative of a desired viewing channel identified by an operator selected one of the channel select designations.

A first processor means receives the first control output signal from the first operator-actuated control means, and upon receipt of the first data set, causes the first memory means to store the desired channel select designation as corresponding to the one channel tuning designation. Upon receipt of the dump control output signal, the first processor means causes the first memory means to dump any contents thereof to the second memory 10 means.

A second processor means receives the second control output signal from the second operator-actuated control means, and upon receipt of the second data set, retrieves from the memory means the one of the channel tuning designations corresponding to the operator selected channel select designation, and generates the processor signal to correspond to the one channel tuning designation.

This embodiment enables a single remote control unit to program more than one television receiver if desired. Accordingly, the first operator actuated control means, the first memory means and the first processor means may be remote from the second operator actuated control means, the second memory means and the second processor means.

Accordingly, it is an object of the present invention to provide a control system for television receivers, particularly although not limited to those receiving cable and/or satellite broadcasts, which is more convenient for use by the viewer; to provide such a system wherein the viewer may select his own channel designations to accommodate his own preference; to provide such a system which may be incorporated into [convention] *conventional* television designs; and to provide such a control system which may be added to conventional designs without undue cost or complication.

Other objects and advantages of the present invention will be readily apparent from the following description, the accompanying drawings, and the appended claims.

DETAILED DESCRIPTION OF THE PREFERRED EMBODIMENTS

Figure 1:
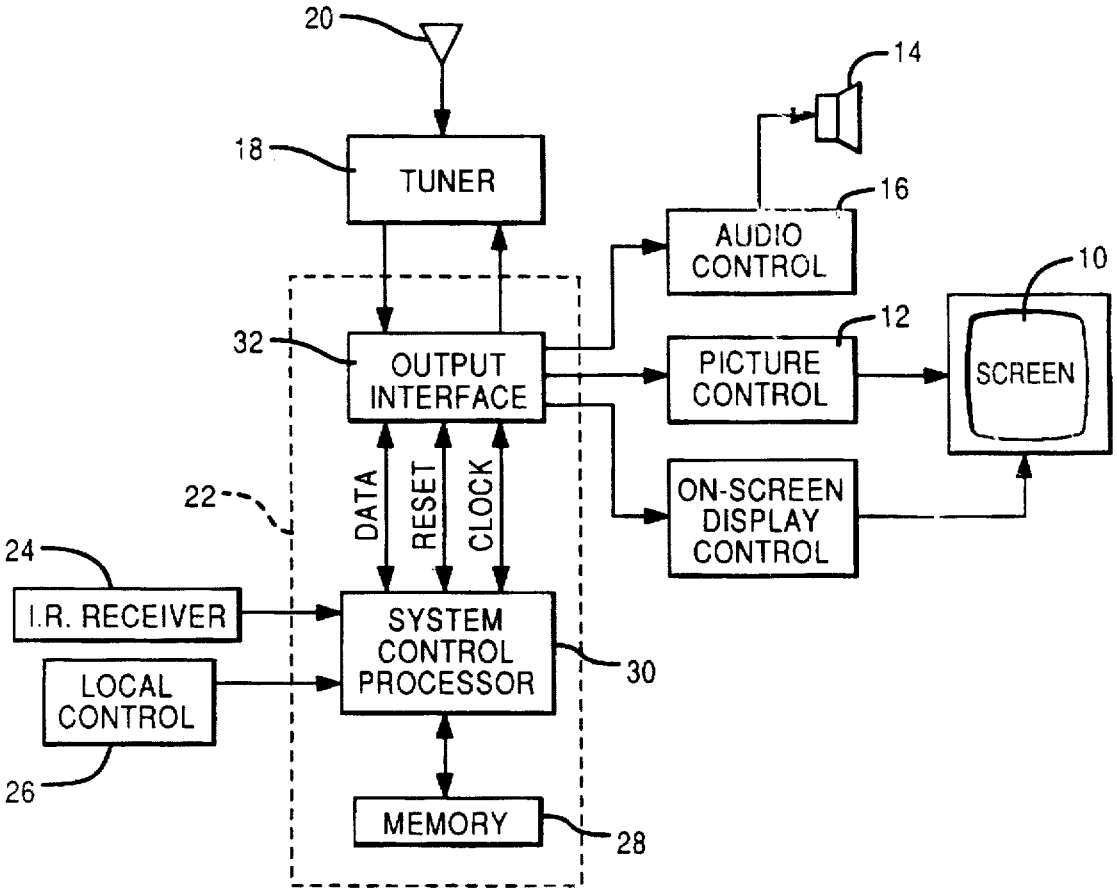
FIG. 1 is a block diagram illustrating the television control system of the present invention incorporated into a television receiver.

A general block diagram of a preferred embodiment of the present invention may be seen generally by reference to FIG. 1. In general, the circuitry comprising the various blocks as shown in FIG. 1 are conventional, and the detailed design of the individual circuits will be readily apparent to one of ordinary skill in such circuitry.

The television system includes a screen 10, under immediate control of picture control circuitry 12 which for description purposes includes various power supply circuits, raster scan circuits, color control circuits and the like which are conventional and typically associated with a television receiver. A speaker 14 or other sound output means receives an audio output signal from audio control circuitry 16, again which includes conventional and typical circuitry including power supply, amplifier, audio filter and similar circuits.

A tuner 18 receives a multi-channel input at 20 and tunes out all but a selected channel for viewing. It will be recognized that the multi-channel input received by tuner 18 at 20 may be a convention cable input signal, but may also be the input signal received from a satellite transmission receiver. Moreover, the present invention may be used with any television input signal, including a conventional over-the-air broadcast signal received through a conventional antenna.

Tuner 18, and indeed, audio control 16 and picture control 12, operate under the control of processing unit 22, which may be any conventional programmable microprocessor or other means capable of receiving input control signals and producing a corresponding output control signal. Processing unit 22 in turn is controlled by an operator-actuated control means. In a preferred embodiment, operator-actuated control means includes a hand-held remote control unit, illustrated in block diagram form in FIG. 2. Input from the remote unit is received, in a preferred embodiment, in the form of infrared transmissions by infrared receiver 24. This input is in turn supplied to processing unit 22. As an alternative, input may be received from a local control 26, such as a keypad or other control means located on the television receiver. Preferably, local control 26 may be provided in addition to a remote control means.

Processing unit 22 includes memory 28 for storing the control program for controlling the television receiver, control processor 30 for receiving input from memory 28 and operator input from either infrared receiver 24 or local control 26 and executing the control program, and output interface 32 for directing the output from control processor 30 to the appropriate circuits. As is known, these components may be located on one or more integrated circuit chips as appropriate.

Figure 2:
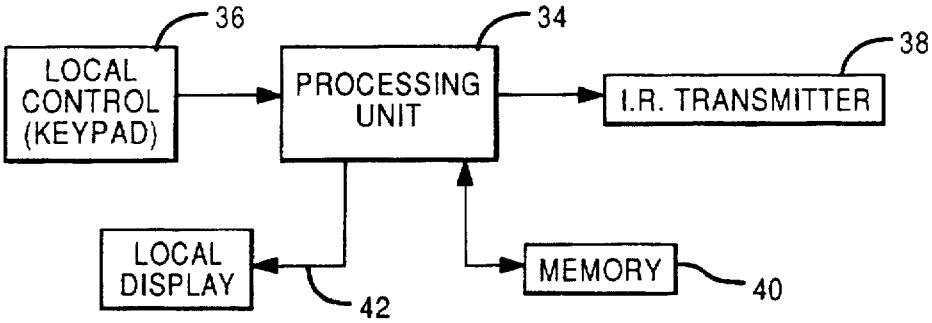
FIG. 2 is a block diagram illustrating a portion of the television control system located within a remote control unit.

One embodiment for a remote control unit may be seen by reference to FIG. 2. The remote unit operates under control of its own processing unit 34, which may be for example a microprocessor located on a single integrated circuit chip. Connected to processor unit 34 is an alpha/numeric keypad 36 for operator input.

In one preferred embodiment, the remote unit is cordless, i.e., without physical connection to the television receiver. Thus, processing unit 36 is connected to a transmitter 38 which generates, preferably, an infrared signal containing the control information. Such information is transmitted to the television receiver unit, being received by receiver 24. Of course, alternative means for transmitting the control signals to the television receiver may be used, such as by other than infrared radiation or ultrasonic waves. In addition, a cable could be used connecting the remote unit to the television receiver.

Associated with processing unit 34 may be a memory 40 which includes some portion of the control data for use in controlling the television receiver. This memory 40 may carry out some functions in place of or in addition to some portion of memory 28 associated with the system control processor 30 of the processing unit 22 for the television receiver. As another option, a local display 42 may be provided for displaying commands as they are entered through the keypad 36, or for displaying control information concerning the television receiver or its tuning.

An important feature of the present invention is the memory available as memory 28 and/or as memory 40. These memories are connected to system control processor 30 and processing unit 34, respectively. At least one of these memories can be both read and written by the corresponding processor, and is preferably an electrically erasable programmable read only memory (EE PROM), or a non-volatile random access memory (NV RAM), the latter preferably equipped with a battery-powered back up. Either of these alternatives are well known to those skilled in the art, and are readily commercially available.

The invention enables the user of the television receiver to select a desired channel using a channel designation which the user or some other operator has previously chosen for the particular channel desired. This designation may be different from the designation assigned by the cable service provider or governmental agency. In this way, the user can select a designation (or "select code") which makes sense to the individual user. Such a designation may be comprised of numeric characters, alphabetic characters, or both. Afterwards, appropriate keys on the keypad 36 of the remote unit are 20 actuated for channel selection. Alternatively, appropriate controls in local control 26 may be actuated for channel selection.

It should be recognized that channel designations other than alpha-/numeric characters could be used. For example, the remote unit keypad 36 could include a series of "preset" keys as is common in radio receivers, possibly coded or designated by key shape, color or the like, which the user could program to correspond to certain desired channels. (Such presets, as with channel designations comprised of characters, could be associated with a "display code" as defined below.)

To facilitate further description of the present invention, the following terminology will be used as defined:

"Channel code" is the numerical (and perhaps also alphabetic) tuner designation at which a particular signal may be found. Such characters are the conventional input to a television receiver control system.

"Select code" is the channel designation chosen by the viewer for subsequent use in selecting a particular channel.

"Display code" is a series of alpha-/numeric characters chosen by the viewer for subsequent display on the television screen or a display panel as a channel is chosen using the select code. The display code may, but does not have to, be different from the select code.

"Cue" is the listing in memory of the various programmed entries made by the viewer, wherein each select code is stored along with its corresponding channel code and display code.

Figure 3:
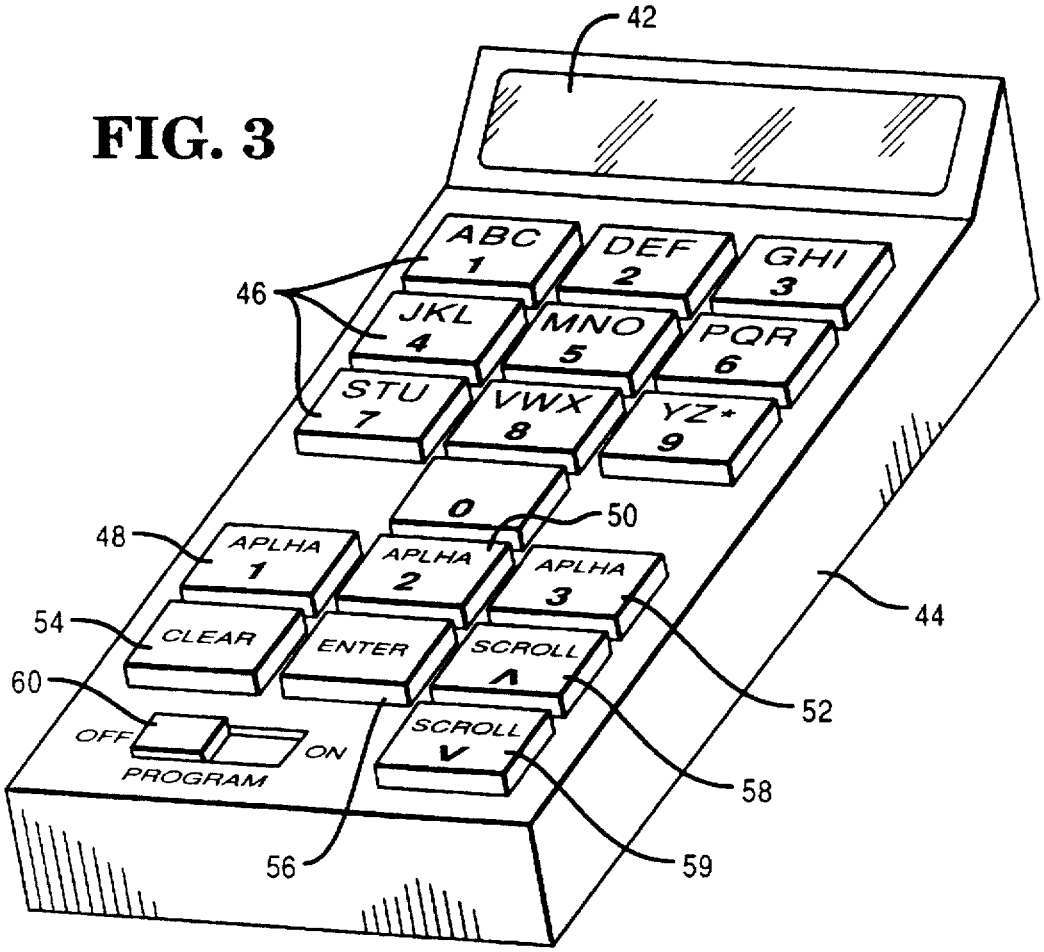
FIG. 3 is a perspective view of a remote control unit which may be used with the control system of FIGS. 1 and 2.

A preferred embodiment for the layout of keypad 36 may be seen on the remote unit shown in FIG. 3. As can be seen, keypad 36 may be mounted in an appropriate housing 44 also containing a power source (not shown) for the remote unit such as a dry cell battery. The keypad includes various specific keys, each with its designation imprinted thereon. For example, alpha-/numeric keys 46 for numerals 0–9 are provided. Alphabetic characters may be provided by the numeric keys as well, with most numeric keys also including up to three alphabetic designations per key. For instances where it is important to specify a particular alphabetic character, "alpha 1" keys 48, 50 and 52 are provided. An input from "alpha 1" key 48, for example, will indicate to processor 30 that the next key input will be one of the alpha-/numeric keys 46, and that such key should be interpreted as the first alphabetic character on the particular key. For instance, "alpha 1" followed by the "5" key will represent the character "M". Similarly, "alpha 2" followed by "4" will represent the character "K".

Keypad 36 also includes several special keys. The "clear" key 54 and "enter" key 56 are used in programming memory 28 and/or 40, as will be described below. Other keys conventional in remote television control devices may be provided, such as a channel advance or "scroll" key 58 to step through a series of channel selections.

Also for use in programming memory 28 and/or 40 is a "program" switch 60, which may for example be a conventional slide switch. Switch 60 is used to alert processor 30 and/or processing unit 34, as will be described below, that input keystrokes are to be used in programming the memory.

It will, of course, be recognized that the remote unit shown in FIG. 3 includes only those controls critical to the system as described herein. It will be readily apparent that other controls may be provided in a known manner on the remote control unit, such as power on/off and audio volume and muting controls.

It will further be recognized that other means of inputing alpha characters using the keypad 36 may be used. For example, more or less than three "alpha" keys 48, 50 and 52 may be provided. A complete set of 26 dedicated alphabetic keys may also be provided.

It will also be realized that while the television control input device is described herein as keys and the like located on a remote control unit, similar controls may be physically located on the television receiver itself. Such controls may be in addition to or in place of those incorporated into a remote unit.

Operation of the control system is in accordance with a program resident in either system control processor 30, located within the television receiver, or processing unit 34 located within the remote unit. Advantages to either location will be apparent to those skilled in the art, although it may be noted that operation of the control system by the remote control processor enables the control system to function as a "universal" remote; that is, the remote control unit incorporating the control system described herein may be used with any television receiver capable of being remotely controlled. This permits the remote control to be manufactured by one other than the television manufacturer, whereas controlling the system from the television receiver as a practical matter requires the remote to be produced by the television manufacturer. On the other hand, this configuration simplifies or eliminates the processing unit 34 from the remote unit.

A preferred embodiment for the control program, regardless of which processor executes the program, may be seen by reference to FIGS. 4–7. The control system operates in either a "channel selection" mode, wherein the operator selects the desired viewing channel using channel designations (select codes) which the operator has previously assigned, or in a "program" mode, wherein the select code assignments are made, changed, reviewed and the like. This latter mode will be described first, with specific reference made to FIG. 4.

The program mode operates in the preferred embodiment as in interrupt; i.e., the program operates in its normal, program selection mode until the program switch 60 is actuated. At such time, the program immediately moves to the routine shown in FIG. 4 beginning at block 62. Conversely, the program mode routine may be interrupted at any time by actuating the program switch 60 to return the control to the normal channel selection mode.

At block 64, the operator is prompted "SELECT TV CHAN" to indicate whether he wishes to assign a channel selection code. An appropriate response in the form of "1" for yes and "0" for no, followed by the enter key (blocks 66 and 68) is entered. If yes, the program moves (block 70) to the select code entry routine shown in FIG. 5. If no, the program prompts the operator in block 72 for "SELECT CUE" wherein the operator may review the cue of previously assigned select and display codes. A response of "1" for yes and "0" for no is followed by the enter key, blocks 74 and 76, whereafter the program either moves to the select cue routine (block 78) shown in FIG. 6, or displays a "CLEAR PROGRAM" prompt at block 80. This prompt gives the operator the option to entirely clear the memory of select and display codes.

In response to this prompt, the operator enters "1" for yes and "0" for no, followed by the enter key, blocks 82 and 84. If the response is no ("0"), the program reverts to the "SELECT TV CHAN" prompt at block 64. If, on the other hand, the response is yes ("1"), the operator is given a confirmation prompt of "ARE YOU SURE?", block 86, to which the viewer responds with "1" or "0" followed by the enter key, blocks 88 and 90. Only if an affirmative response is received will the memory be cleared, block 92. In the preferred embodiment, clearing of the memory substitutes codes wherein the select code is made equal to the tuning channel so that the television receiver may be used in a conventional manner.

Figure 4:
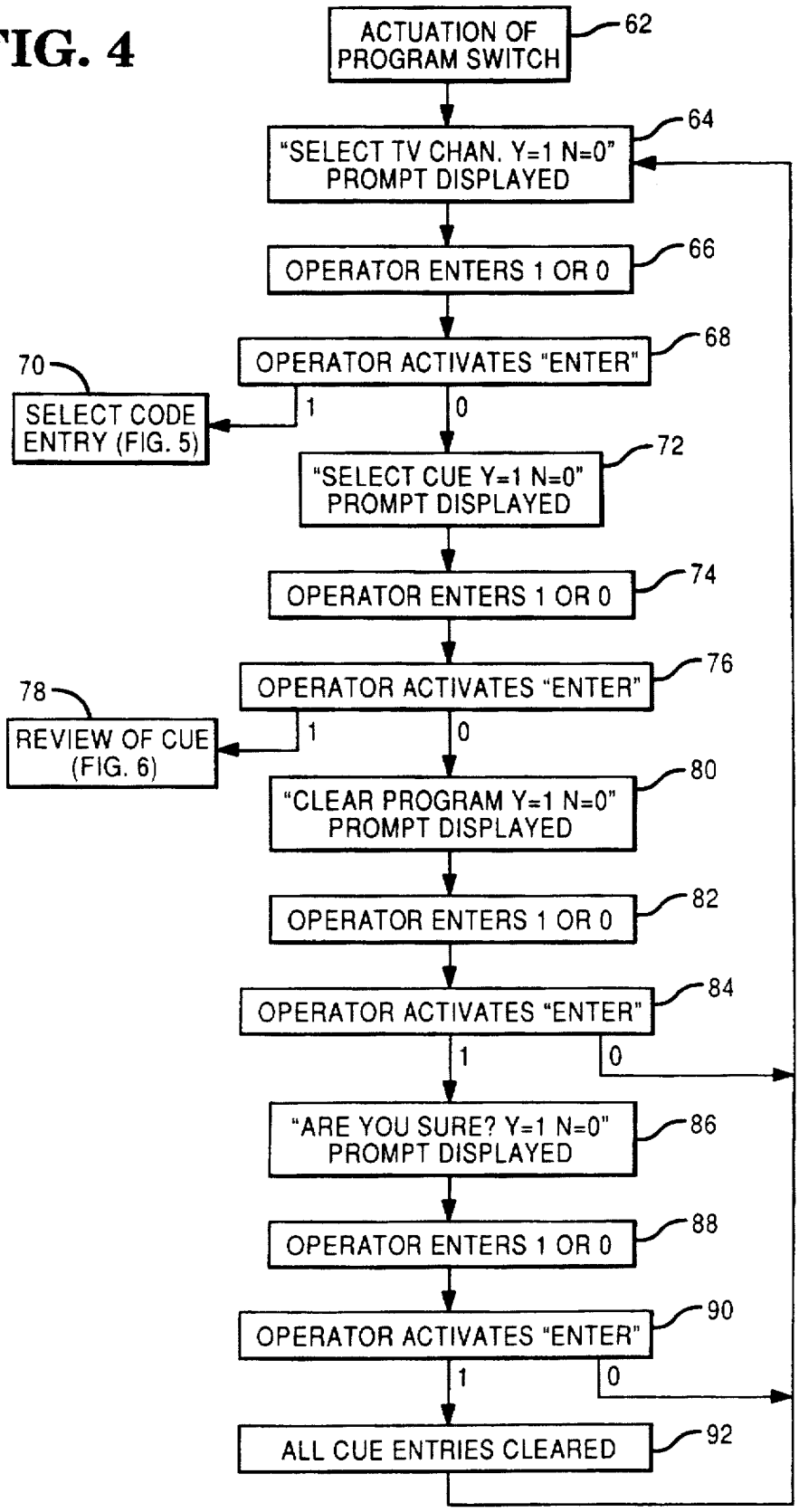
FIG. 4, FIG. 5 (comprising FIGS. 5A and 5B), FIG. 6 (comprising FIGS. 6A and 6B) and FIG. 7 (comprising FIGS. 7A and 7B) are flowchart diagrams of a program for operating the control system of the present invention.
Figure 5A:
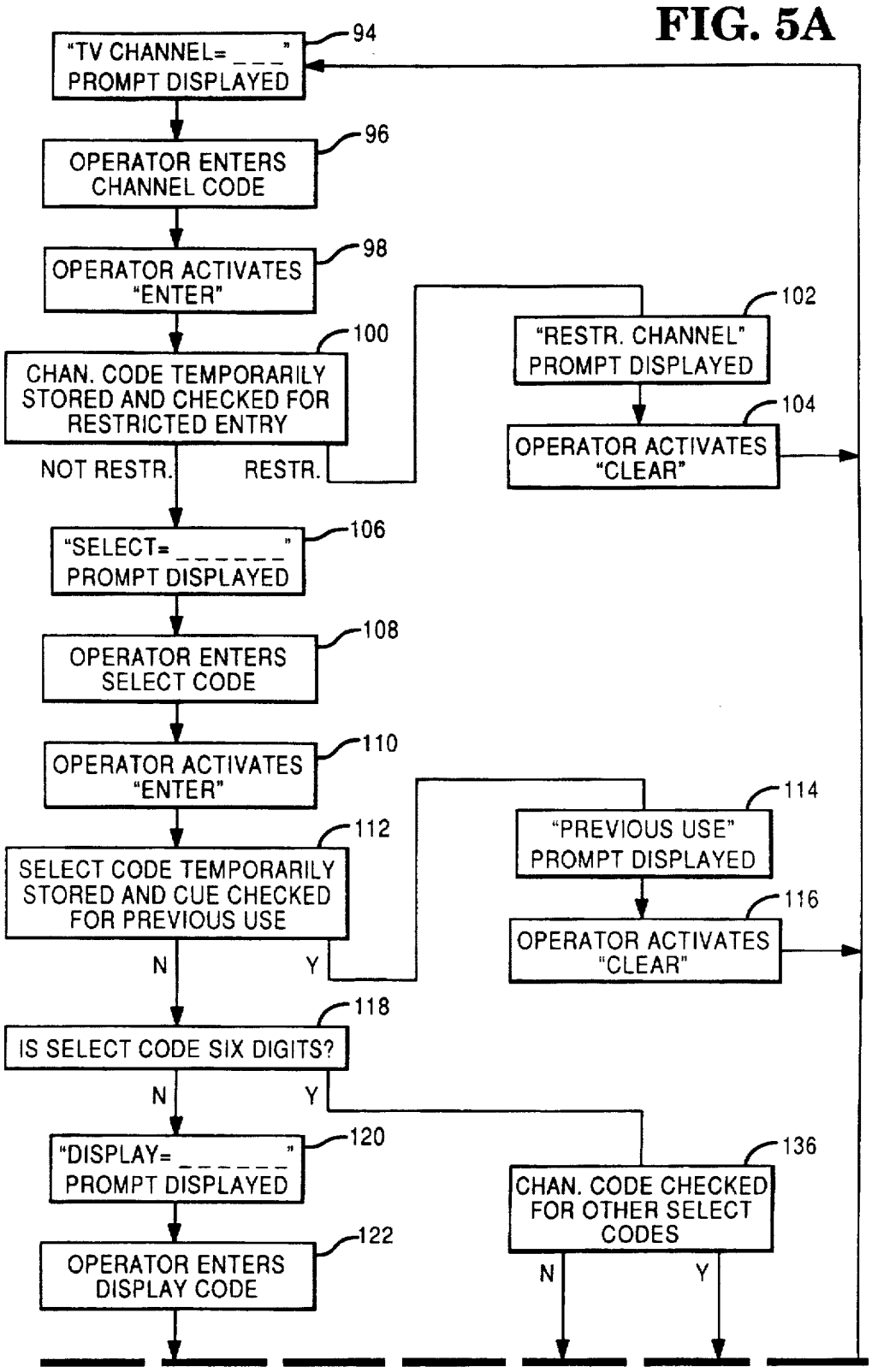
Figure 5B:
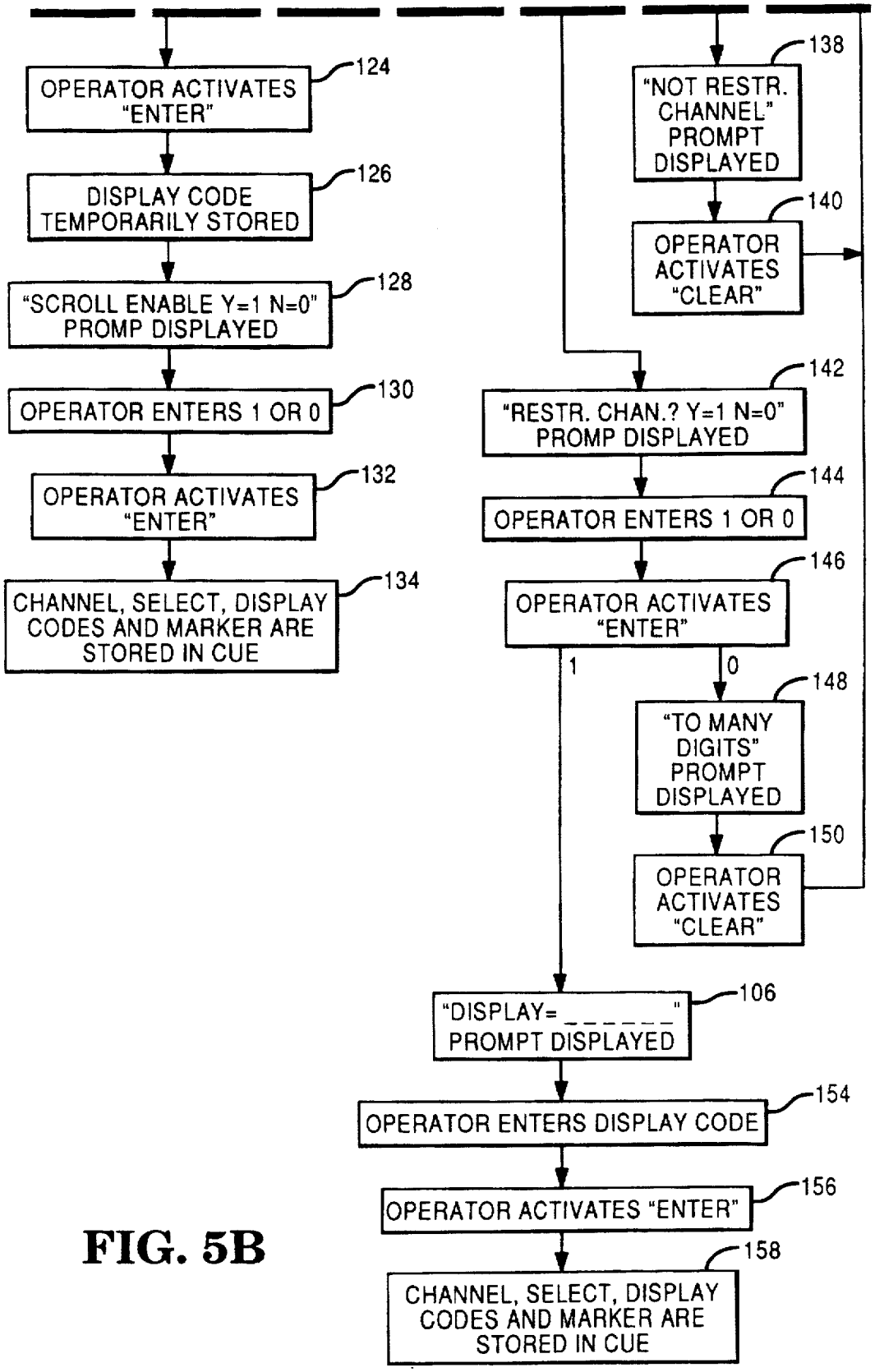

Referring now to FIG. 5 (comprising FIGS. 5A and 5B), the select code entry routine may be seen. This routine is entered from block 70 in FIG. 4, and commences with block 94 whereat the operator is prompted "TV CHANNEL=_ _ _". In response, the operator enters the characters (typically numeric) corresponding to the tuner designation (or "channel code") for the desired channel, block 96. Upon receipt of an "enter" keystroke, block 98, the entered channel code is temporarily stored in memory, block 100, while the channel cue is checked to determine whether any select codes have been previously assigned to the channel on a restricted (or password) basis.

One feature of the present invention is the ability to designate particular channels such that they may only be selected by entry of a password. Any selectable channel may be made such a restricted channel, thereby enabling, for example, a parent to restrict access to certain channels by children. As will be seen from the further description of the preferred embodiment, such feature can be readily incorporated into the control system of the present invention.

As noted, when a particular channel code is entered for assigning a select code thereto, a check is made to determine whether this channel has previously been assigned a restricted access (password required) select code. This is to ensure that a restricted channel is not assigned both a restricted and unrestricted select code, thereby defeating the restricted access. If the channel has been made restricted, a message "RESTRICTED CHANNEL" is displayed as flashing on the remote control unit display or on the television screen, block 102. The operator in response actuates the "clear" key 54, block 104, whereafter the program returns to block 94 to request entry of a tuner channel.

If the requested tuner channel has not been previously made restricted, as determined at block 100, the operator is prompted (block 106) with "SELECT=_ _ _ _ _ _". In response, the operator enters his desired select code of up to six characters, block 108, followed by the enter key, block 110. A check is made at block 112 as to whether the entered select code has been previously used and if so, a flashing display "PREVIOUS USE" is shown (block 114) until the user actuates the "clear" key (block 116).

In the preferred embodiment, a select code may contain a maximum of six characters, although a code for a restricted channel must contain six characters and an unrestricted [channel] *select* code must include less than six. Of course, it will be recognized that any other means may be used for distinguishing between restricted and unrestricted channels, but in the program of the preferred embodiment, a check of the entered code is next made at block 118 to determine whether the entered select code includes six characters. If less than six characters are found, indicating a nonrestricted code, the program moves to block 120.

One further feature of the preferred embodiment of the present invention is the ability to select a display code which differs from the select code used by the operator to choose a channel for viewing. When a channel is selected for viewing, the display code is displayed either on the hand held remote display, on a display associated with the television receiver controls, or directly on the television screen. As can be seen, the display code may be entirely different from the select code (but need not be), so that the operator may choose, for example, the channel number of the selected channel to be displayed along with the station call letters, network affiliation, or other description. Thus, at block 120, the user is prompted "DISPLAY=_ _ _ _ _ _ _", with a maximum display of six characters provided in this embodiment. The operator enters these characters at block 122, actuates the enter key at block 124, and the display code is temporarily stored at block 126.

Yet another feature of the preferred embodiment is the ability of the operator to designate only certain channels to be placed into a "scroll" so that the operator may later "scroll" by actuating a single key through a number of frequently watched channels. Those channels to be placed in the scroll are flagged with a marker bit. Thus, at block 128, the operator is presented the opportunity to so mark the channel by responding to the prompt "SCROLL ENABLE". At block 130, the user responds with "1" to enable scrolling of the channel and "0" to not enable, followed by the enter key at 132.

The program the enters the channel code, select code, display code and scroll marker into the channel selection cue in the alpha-numeric order of select code. The program then returns to the point at which [the] *then* program interrupt was initiated.

It is possible, in addition to the entries made as described above, to provide for entry along with the marker bit one or more order bits. Such entry makes it possible for the operator to predetermine the order of channels during scrolling. Details of the various means by which such a feature could be provided are within the ordinary level of skill within the art.

If, at block 118, the program determines that the entered select code includes six characters, thereby signifying a restricted channel, the program branches to block 136 where a check is made to determine whether any other select codes exist for this tuner channel. If some other select code is noted, indicating that the channel is not in fact a restricted channel, a display is presented at block 138 such as "NOT RESTRICTED CHANNEL". Once the operator clears this display using the clear key, block 140, the program returns to block 94.

If the tuner channel does not have a select code already associated therewith, the operator is prompted at block 142 with "RESTRICTED CHANNEL?" to insure that the operator intends for the particular channel to be restricted. The operator responds at block 144 with "1" for "yes" or "0" for "no", followed by the enter key at block 146. If the response was "0", a display of "TOO MANY DIGITS" is shown at block 148, until the operator actuates the "clear" key at block 150 to return the program to block 94. If the response was "1", the operator is next prompted at block 152 with "DISPLAY=_ _ _ _ _ _ _". The operator enters, block 154, the desired display code to be presented whenever the channel in question is selected, followed by the enter key at block 156.

At block 158, the program then enters the tuner channel, select code, and display code into the memory cue. This data is preferably entered in order of tuner channel designation, to further make difficult entry of the select code by an unauthorized operator. The program then pauses until the program switch is actuated to take the apparatus out of the control mode.

Figure 6A:
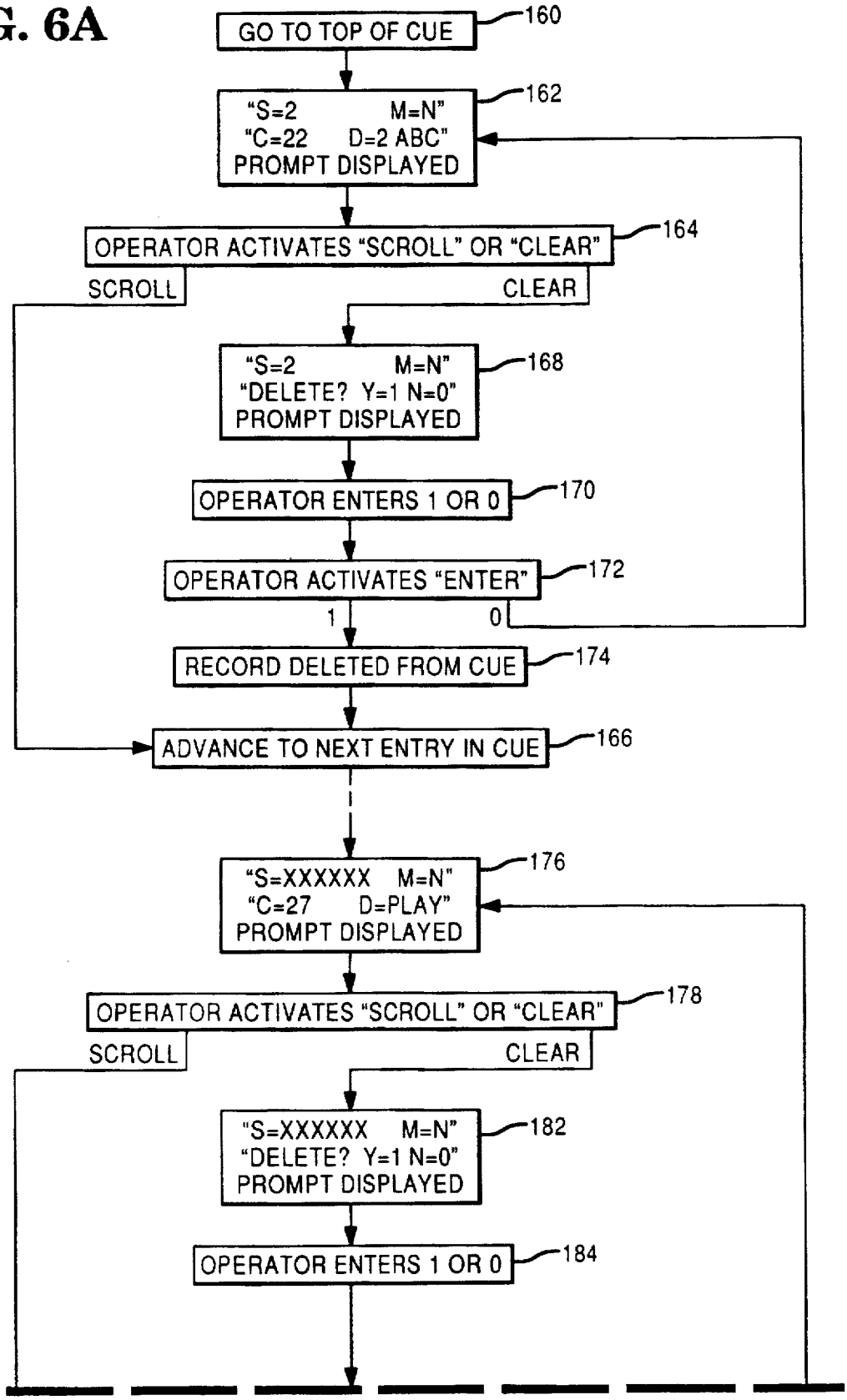
Figure 6B:
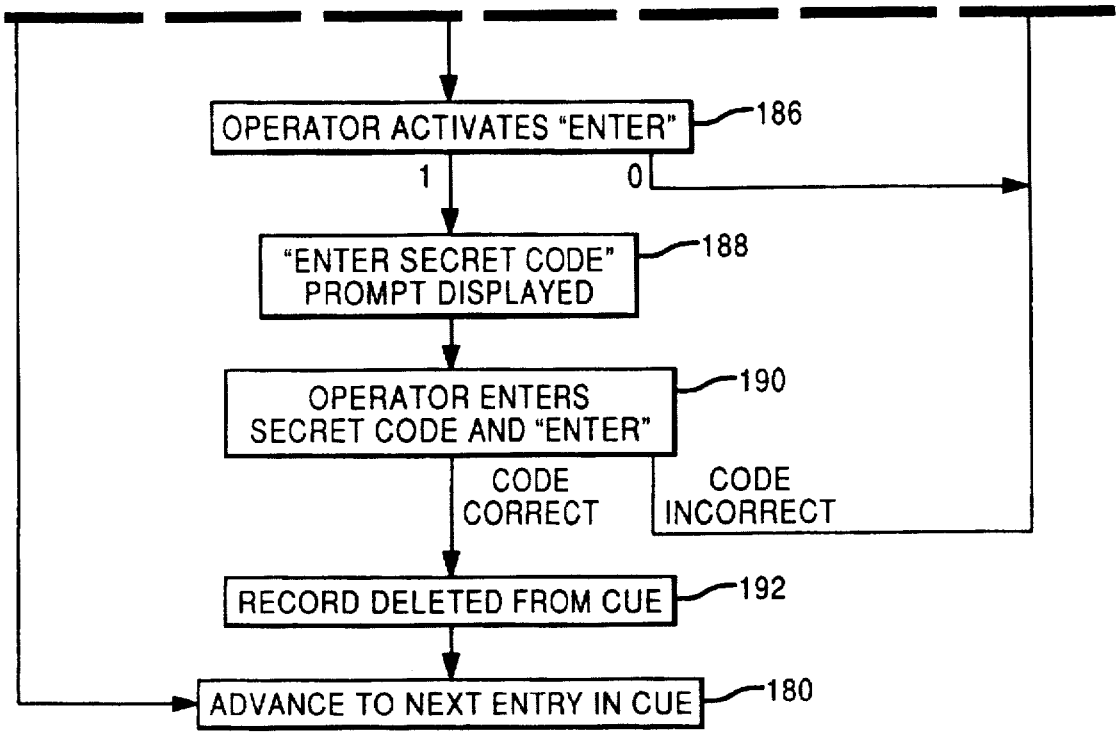

The final portion of the program mode of the control system is the "SCROLL SELECT", entered form block 78 of FIG. 4, and which enables the operator to review the memory cue and codes contained therein. Referring now to FIG. 6 (comprising FIGS. 6A and 6B), the program initially begins at the top of the cue, block 160, and displays the initial entry, showing its channel code, select code, display code and whether a marker bit has been entered for scrolling during channel selection. A sample display for an unrestricted channel selection is shown in block 162.

At this point, the operator may enter, block 164, either the "scroll" key or the "clear" key. In the former case, the program simply scrolls ahead to the next item in the cue, block 166. In the latter, the operator is prompted with "DELETE, Y=1 N=0", block 168. The operator then enters either "1" or "0", block 170, followed by the enter key, block 172. If the operator chooses "1", the cue entry is deleted, block 174, and the program scrolls forward to the next entry in the cue, block 166. If the operator chooses "0", the program returns to block 162 where the cue entry is simply displayed.

It should be noted that in a preferred embodiment, preprogrammed entries in memory are provided initially wherein the select code and display code are simply the same as the channel code. These entries are written over as select codes are chosen for the various channels. However, in the event all [display] *select* codes for a given channel are deleted, the memory may be designed to reinstate the original entry for that channel code, so that such channel may be chosen by entering its tuner designation. A particular advantage of this feature is that the remote unit may be operated immediately to control the television receiver without programming.

A sample cue display for a restricted channel may be seen in block 176. It will be noted that the select code is shown as "S=XXXXXX", with the characters "X" used in place of the actual characters of the code. The operator enters, at block 178, either the "scroll" or "clear" key, with use of the scroll key advancing the scroll to the next item in the cue, block 180. If the clear key is used, the prompt "DELETE Y=1, N=0" is shown, block 182. The operator enters "1" or "0", block 184, followed by the enter key, block 186. If "0" is entered, the original display is again shown, block 176. If "1" is entered, the operator is prompted "ENTER SECRET CODE NOW", block 188, whereafter the operator must respond with the same secret code used to select the restricted channel followed by the enter key, block 190. Only if the correct code is entered is the entry deleted from the cue, block 192. Entry of an incorrect code returns the program to block 176. After deleting the entry, the program moves to the next record in the cue, block 182.

In the normal channel selection mode of operation, channels may be selected either by select code entry or by scrolling. In the case of scrolling, no flowchart is presented due to the simplicity of the operation. Each time the "scroll" key is actuated, the program advances to the next item in the cue. This entry is checked for the presence of a marker bit. If none is found, the program simply advances through the cue until a marker is found. The corresponding channel is then displayed on the screen, and the appropriate display code is also presented. Such routine is appropriate whether the "scroll up" key 58 or the "scroll down" key 59 is actuated; the particular key simply affects the direction of advance through the cue.

Figure 7A:
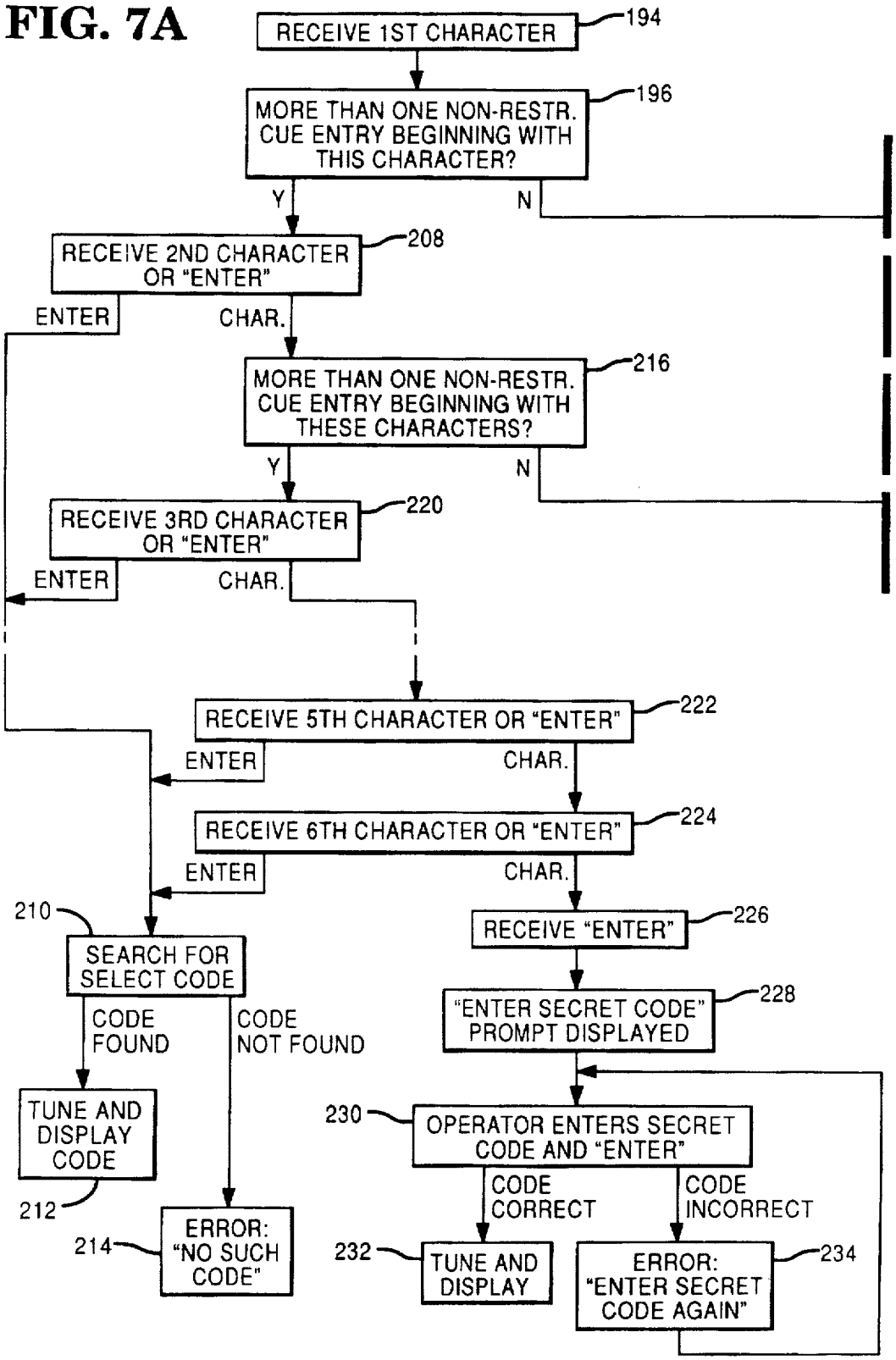
Figure 7B:
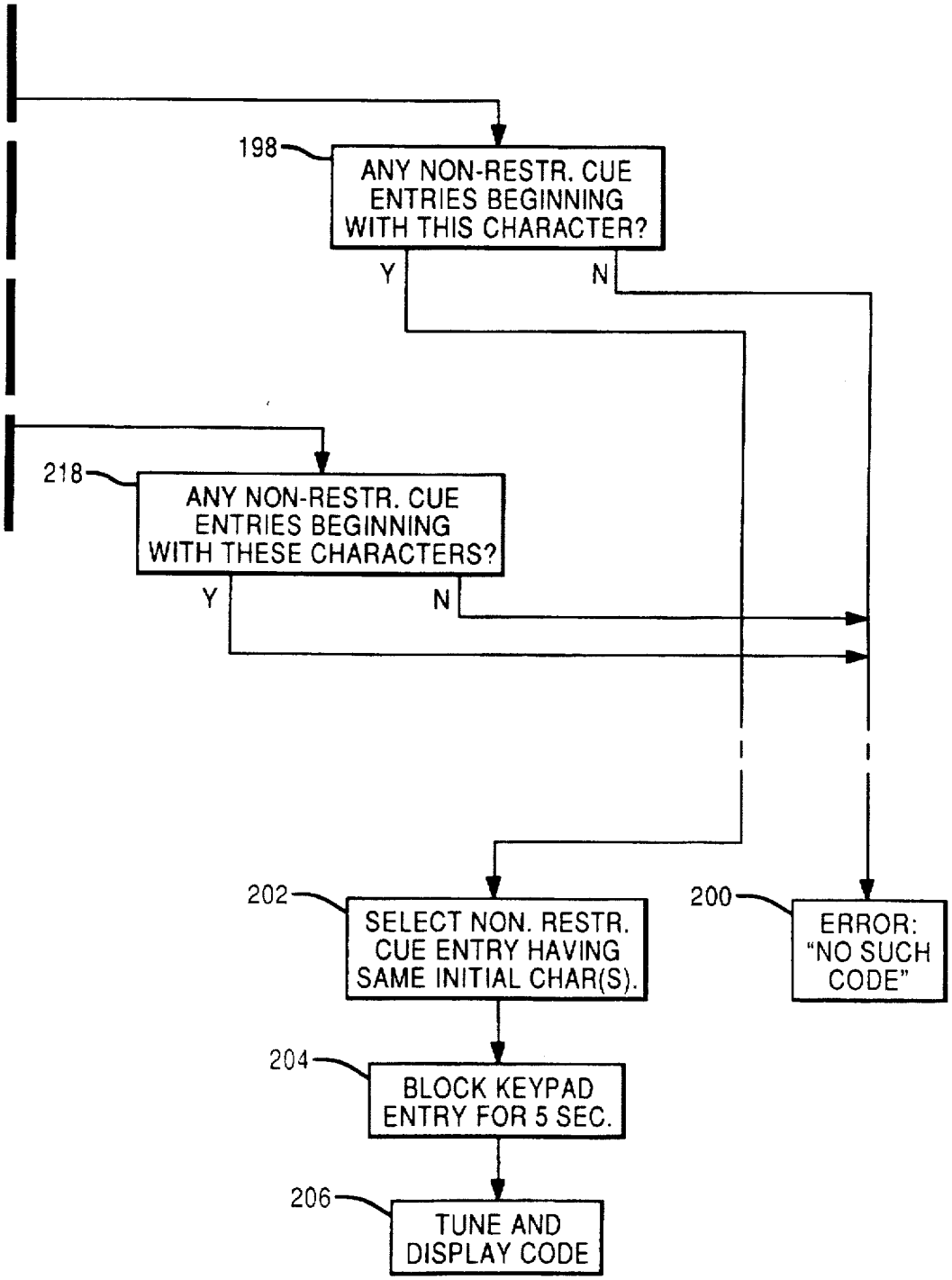

Channel selection may be seen by reference to FIG. 7 (comprised of FIGS. 7A and 7B). For channel selection, the operator enters the select code for the desired channel, followed by the enter key. However, provision is made within the program for selection of the desired channel after entry of less than all the characters of the select code if such characters are unique to a single code. In other words, if the user has entered a [display] *select* code "225" for a particular channel and no other [display] *select* code begins with the numeral "2", entry of the single character "2" will cause tuning of the receiver to the channel identified by the full code "225".

Select codes comprising alphabetic characters may be handled in several manners, as will be appreciated by those skilled in the art, depending upon the details of the program. As one alternative, a select code may be initially entered using the alphabetic designations of the keys (and using the appropriate "alpha" keys; see FIG. 3), but may be recalled for channel selection using only the numeric designations of the corresponding keys. For example, a select code "ABC" may be originally entered using the keystrokes (see FIG. 3) "alpha 1" key, "A (or 1)" key, alpha "2" key, "B (or 1)" key, "alpha 3" key and "C (or 1)" key. Channel selection may be made simply by actuating "1", "1", "1".

Such an approach may be disadvantageous in that it precludes other select codes such as "111", "CBA" or "B11". Thus, as a further alternative, the program may be written to permit selection of select codes containing alphabetic characters using corresponding numerals only if no conflict exists. Otherwise, the select code must be entered using the "alpha" keys.

Referring now to FIG. 7, the initial character is received at block 194. Immediately, the program checks at block 196 to determine whether more than one non-restricted select code begins with the entered character. (Restricted channels are treated as special cases and require entry of all six characters, followed by entry of the secret code.) If there is no more than one select code beginning with the entered character, the program checks at block 198 whether there are any entries which begin with the initial character. If not, an error message is given, block 200, and the program erases the entered character and awaits further input.

If at block 198 a single select code beginning with the first character is found, the program moves to block 202 where the select code having the entered initial character is selected from the non-restricted cue. At block 206, further keypad entry is temporarily blocked to avoid processing any further characters, and the selected channel is tuned and the corresponding display code is presented, block 206.

Returning to block 196, if more than one select code begins with the entered initial character, the program proceeds to block 208 where the next keystroke, either a further character or the enter key, is received. If the keystroke is the enter key, the [display] *select* code has been completely entered (consisting of one character). At block [208] *210*, a search for the entered select code is performed, and if such a code is found, the appropriate channel is tuned and display code is presented, block 212. If no such code is found, an error message such as "NO SUCH CODE" is presented, block 214.

At block 208, the next keystroke may be a second character. As before, at block 216, a check is made as to whether more than one [display] *select* code begins with the first two characters. If not, and if in fact no such [display] *select* codes so begin, block 218, the appropriate error message is shown, block 200. If from block 218 a single corresponding select code is found, the corresponding channel is selected, blocks 202, 204 and 206. If more than one select code begins with the two entered characters at block 216, then a third character or an enter key is awaited at block 220.

Similar processing of the third and fourth characters, if any, are performed. Such operations are not shown in FIG. 7 except by broken lines, but will be readily understood.

At block 222, the next entry can be either a fifth character or the enter key following the fourth character. If an enter key, the program proceeds to block 210 to work with the entered select code. If a fifth character, there is no need to consider whether more than one non-restricted code begin with the initial five characters since such a situation is not possible, and the program accordingly at block 224 awaits the entry of the enter key or a sixth character. If an enter key is received, the program moves to block 210. If a sixth character is received, the viewer has requested a restricted channel.

After receiving the sixth character at block 224, the program awaits an enter key at block 226. At block 228, the message "ENTER SECRET CODE" is displayed. The operator enters the secret code followed by an enter key at block 230, whereafter the code is checked to determine whether it is valid. If the code is correct, the selected channel is tuned and the corresponding display code is shown at block 232. If the code is incorrect, the error message "ENTER CODE AGAIN" is given at block 234, with the program returning to block 230 to await reentry of the secret code.

Throughout the channel selection routine, entry of the clear key will interrupt the channel selection program and return the program to a standby mode.

Other alternatives to the foregoing program will be readily apparent to those skilled in the art. What is important is that means be provided whereby the user may enter his own selected designations for available channels, and that those user-designated channel identifications be used in selecting a channel for viewing.

However, it will be recognized that the processor, whether incorporated in the television receiver or in a hand-held remote, may be used to perform other tasks in addition to enabling user-designations to identify particular available channels. For example, a clock circuit may be included, whereby restricting of channels unless the proper code is entered may be made necessary only during preselected days and/or times. In this way, parents for example may preclude children from viewing particular programs while leaving the channel in question available at other times. The manner in which the processor may be programmed to carry out this feature will be readily apparent to those skilled in the art.

Another additional feature may be incorporated with respect to the "scroll" ability of the control system. As described in connection with the preferred embodiment, a single, binary marker bit is used whereby a single scroll order is provided. However, it will be recognized that a multiple bit marker may be used. In such a case, it will be possible to create more than one scroll sequence. Such sequences may be used to create subject matter scrolls (e.g., news, educational programming, entertainment programming and the like), or individual scroll sequences for each member of the same household.

Further, the preferred embodiment is described as incorporating an easily accessible program switch. It should be recognized, however, that the present invention may also be used in embodiments wherein programming of the control system, while similar in operating concept, is more difficult to carry out. For example, hotels may wish to locate programming switches as DIP switches or the like positioned internally of the television receiver and/or remote unit to prevent guests from programming the units in a nonuniform manner. Alternatively, programming could be carried out remote from the unit, such as by utilizing a removable chip for the system memory. As yet a further alternative, the television receiver could include an accessible data port. In such a case, again using a hotel as an example, access to "premium" channels such as movie channels could be authorized only by office personnel through the data port.

A further alternative to programming the control system through a data port is to program the system through the cable itself. Such an alternative might be useful, for example, where the cable service company itself wishes to program its subscriber's control systems to match the designations it uses for channels which it provides, or the designations used by local newspapers in providing program information. One cable channel may be reserved for transmitting the necessary data. The control system may be made responsive to such channel either on a periodic basis, or upon receiving an instruction to program itself from the incoming data stream.

One cable provider may wish to provide multiple programmed series, useful for example where a cable provider serves an area covered by newspapers using different designations in their television listings. While this approach can be implemented in a number of ways, one possibility is to reserve a separate cable channel for each channel designation series. This will in fact enable the user to select the series desired, by tuning to the appropriate channel for programming of the control unit.

Of course, it will be readily recognized that some portions of the television controller memory may be available for programming to the cable service provider, while other portions of the memory may be available for programming by the viewer. For example, the cable provider may determine the display code, while the viewer may establish the select codes.

It has been mentioned that similar controls may be provided both on a remote control unit and on the television receiver itself. This may require separate programming of each control system for the same television receiver. As an alternative to this approach, the remote unit may be provided with a memory which serves merely to store the control data as it is being entered. Referring back to FIGS. 1 and 2, local control 36 of the remote unit (FIG. 2) provides the user input to processing unit 34 regarding the select codes to be used for channel selection. This data is retained in memory 40. A memory dump control is provided on control 36, so that once user input is completed, the memory contents may subsequently be dumped through transmitter 38 to the receiver 24 located with the television receiver (FIG. 1). This data is then directed by processor 30 to the memory 28 associated with the control system located on the television receiver. Channel select codes subsequently entered at the remote are simply passed through to the receiver's controls, where channel selection is made in a manner as already described.

Hence, the remote serves to "teach" the television receiver. This approach will be particularly useful where the user wishes to program two or more television receivers. Once the remote has received the programming information, the remote may be used to teach any number of television receivers.

Specific implementation of any of the alternatives described herein will be readily apparent to those skilled in the art, and may be accomplished using techniques well known in the art of circuit design.

It will also be recognized that while frequent reference is made herein to a "television receiver", such reference is intended to include not only conventional television sets, but also videocassette recorders, satellite receivers, or any other apparatus capable of tuning a television signal from a multiple-channel source.

While the methods described herein, and the apparatus for carrying these methods into effect, constitute preferred embodiments of the present invention, it should be recognized that changes may be made therein without departing from the scope of the present invention, which is defined in the appended claims.

What is claimed is:

1. In a television control system apparatus for selecting a television channel corresponding to a preassigned channel tuning designation, the system apparatus comprising:

tuner means for receiving a processor signal and a multi-channel input signal, and in response to said processor signal, tuning out all but one channel corresponding to a selected one of said preassigned channel tuning designations;

memory means for storing at least one operator-assigned channel select designation for at least one of said channel tuning designations;

first operator-actuated control means for generating a first control output signal comprising a first data set representative of a desired channel select designation for one of said channel tuning designations;

second operator-actuated control means for generating a second control output signal comprising a second data set representative of a desired viewing channel identified by an operator selected one of said channel select designations;

processor means for receiving said first and second control output signals from said first and second operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;

said first control output signal comprising a first one of said channels of said multi-channel input signal;

said processor means including means for generating said processor signal to cause said tuner means to tune out all but said first one of said channels, and for receiving from said turner means said first control output signal comprising said first one of said channels.

2. Apparatus as defined in claim 1, wherein said first operator actuated control means is remote from said second operator actuated control means.

3. In a television control system apparatus for selecting a television channel corresponding to a preassigned channel tuning designation, the system apparatus comprising:

tuner means for receiving a processor signal and a multi-channel input signal, and in response to said processor signal, tuning out all but one channel corresponding to a selected one of said preassigned channel tuning designations;

first memory means for storing at least one operator-assigned channel select designation for at least one of said channel tuning designations;

second memory means for storing said operator-assigned channel select designations for said channel tuning designations;

first operator-actuated control means for generating a first control output signal comprising a first data set representative of a desired channel select designation for one of said channel tuning designations and for generating a dump control output signal;

second operator-actuated control means for generating a second control output signal comprising a second data set representative of a desired viewing channel identified by an operator selected one of said channel select designations;

first processor means for receiving said first control output signal from said first operator-actuated control means, and upon receipt of said first data set, causing said first memory means to store said desired channel select designation as corresponding to said one channel tuning designation, and upon receipt of said dump control output signal, causing said first memory means to dump any contents thereof to said second memory means; and second processor means for receiving said second control output signal from said second operator-actuated control means, and upon receipt of second data set, retrieving from said memory means the one of said channel tuning designations corresponding to said operator selected channel select designation, and generating said processor signal to correspond to said one channel tuning designation.

4. Apparatus as defined in claim 3, wherein said first operator actuated control means, said first memory means and said first processor means are remote from said second operator actuated control means, said second memory means and said second processor means.

*5. A method of controlling a television receiver capable of tuning from a multi-channel input a television channel corresponding to a preassigned channel tuning designation upon receipt of a channel tuning control signal, comprising the steps of:*

*generating using an operator-actuated control means a first control output signal comprising a first data set representative of at least one desired channel select designation for at least one of said channel tuning designations;*

*storing in a memory said channel select designation as corresponding to the respective one of said channel tuning designations;*

*generating using said operator-actuated control means a second control output signal comprising a second data set representative of a desired viewing channel identified by an operator selected one of said channel select designations;*

*retrieving from said memory the one of said channel tuning designations corresponding to said operator selected channel select designation; and*

*generating said channel tuning control signal to correspond to said one channel tuning designation.*

*6. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation;*

*said memory means including means for initially storing a channel select designation for at least one of said channel tuning designations which is identical thereto.*

*7. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker/order bit for at least one of said channel tuning designations, for retaining slid channel tuning designations in an ordered cue;*

*operator-actuated control means for generating a control output signal comprising one of (a) a first data set representative of the presence of said marker/order bit associated with one of said channel tuning designations, and (b) a second data set representative of a command to advance to a subsequent channel tuning designation within said cue;*

*processor means for receiving said control output signal from said operator-actuated control means, and upon receipt of said first data set, causing said memory means to store any of said marker/order bits associated with one of said channel tuning designations corresponding to the respective place of said channel tuning designation within said cue, and upon receipt of said second data set, reviewing said cue to determine a next in order of said channel tuning designations to have one of said marker/order bits associated therewith, and generating said processor signal to correspond to said next channel tuning designation.*

*8. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing a marker value for at least one of said channel tuning designations, and means for retaining said channel tuning designations in a plurality of ordered cues;*

*operator-actuated control means for generating a control output signal comprising one of (a) a first data set representative of the presence of said marker value associated with one of said channel tuning designations and one of said cues, and (b) a second data set representative of a command to advance to a subsequent channel tuning designation within a selected one of said cues;*

*processor means for receiving said control output signal from said operator-actuated control means, and upon receipt of said first data set, causing said memory means to store any of said marker values associated with one of said channel tuning designations, and upon receipt of said second data set, reviewing the corresponding one of said cues to determine a next of said channel tuning designations to have one of said marker values associated therewith which corresponds to said cue, and generating said processor signal to correspond to said next channel tuning designation.*

*9. A television control apparatus as defined in claim 8, wherein said control means further includes means for generating a cue selection signal corresponding to one of said cues, and wherein said processor means, upon receipt of said cue selection signal reviews the one of said cues corresponding thereto.*

*10. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation;*

*wherein said memory means includes means for storing a marker value for each of said channel select designations, and means for retaining said channel select designations in a plurality of ordered cues;*

*said control means including means for generating, at the selection of the operator, a part of said first data set representative of the presence of said marker value associated with one of said channel select designations and one of said cues, and means for generating a third data set representative of a command to advance to a subsequent channel select designation within a selected one of said cues;*

*said processor means, upon receipt of said first data set, causing said memory means to store any of said marker values associated with one of said channel select designations, and upon receipt of said third data set, reviewing the corresponding one of said cues to determine a next of said channel select designations to have one of said marker values associated therewith which corresponds to said cue, and generating said processor signal to correspond to said next channel select designation.*

*11. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation;*

*wherein said memory means includes means for initially storing a channel select designation for each of said channel tuning designations which is identical thereto;*

*said operator-actuated control means including means for generating a memory clear signal;*

*said processor means including means for receiving said memory clear signal, and in response thereto, clearing said memory and restoring therein said channel select designation for each of said channel tuning designations which is identical thereto.*

*12. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*first operator-actuated control means for generating a first control output signal comprising a first data set representative of a desired channel select designation for one of said channel tuning designations;*

*second operator-actuated control means distinct and remotely located from said first operator-actuated control means for generating a second control output signal comprising a second data set representative of a desired viewing channel identified by an operator selected one of said channel select designations;*

*processor means for receiving said first and second control output signals from said first and second operator-actuated control means, and upon receipt of said first data set, causing said memory means to store*

*said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation.*

*13. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*first operator-actuated control means for generating a first control output signal comprising a first data set representative of a desired channel select designation for one of said channel tuning designations;*

*means for receiving said first data set and causing said memory means to store said desired channel select designation as corresponding to said one channel tuning designation;*

*second operator-actuated control means distinct and remotely located from said first operator-actuated control means for generating a second control output signal comprising a second data set representative of a desired viewing channel identified by an operator selected one of said channel select designations;*

*processor means for receiving said second control output signal from said second operator-actuated control means, and upon receipt thereof, retrieving from said memory means the one of said channel tuning designations corresponding to said operator selected channel select designation, and generating said channel tuning control signal to correspond to said one channel tuning designation.*

*14. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation;*

*wherein said memory means includes means for storing more than one of said channel select designations corresponding to a single one of said channel tuning designations.*

*15. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker bit for at least one of said channel tuning designations, for retaining said channel tuning designations in an ordered cue;*

*operator-actuated control means for generating a control output signal comprising one of (a) a first data set representative of the presence of said marker bit associated with one of said channel tuning designations, and (b) a second data set representative of a command to advance to a subsequent channel tuning designation within said cue;*

*processor means for receiving said control output signal from said operator-actuated control means, and upon receipt of said first data set, causing said memory means to store any of said marker bits associated with one of said channel tuning designations corresponding to the respective place of said channel tuning designation within said cue, and upon receipt of said second data set, reviewing said cue to determine a next in order of said channel tuning designations to have one of said marker bits associated therewith, and generating said processor signal to correspond to said next channel tuning designation;*

*said memory means including means for storing at least one order bit for each of said channel tuning designations which have one of said marker bits associated therewith which comprises said means for retaining said channel tuning designations in said ordered cue;*

*said processor means, upon receipt of said first data set, causing said memory means to store an order bit associated with said channel tuning designation which has one of said marker bits associated therewith corresponding to the respective place of said channel tuning designation within said cue, and upon receipt of said third data signal, determining said next of said channel tuning designations which have one of said marker bits associated therewith by reviewing said order bits.*

*16. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and in response to said first data set, causing said memory means to store said desired channel select designation as corresponding to said one channel tuning*

*designation, and in response to said second data set, retrieving from said memory means the one of said channel tuning designations corresponding to said operator selected channel select designation, and generating said channel tuning control signal to correspond to said one channel tuning designation;*

*said memory means including means for initially storing a channel select designation for at least one of said channel tuning designations which is identical thereto.*

*17. A television control system as defined in claim 16, wherein said memory means includes means for storing, for a plurality of said channel tuning designations, a channel select designation for each of said plurality of channel tuning designations which is identical thereto.*

*18. A television control system as defined in claim 17, wherein said multi-channel input includes a plurality of active channels, said memory means including means for storing a channel select designation for each of said active channels which is identical thereto.*

*19. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker/order bit for at least one of said channel tuning designations, for retaining said channel tuning designations in an ordered cue;*

*operator-actuated control means for generating a control output signal comprising one of (a) a first data set representative of the presence of said marker/order bit associated with one of said channel tuning designations, and (b) a second data set representative of a command to advance to a subsequent channel tuning designation within said cue;*

*processor means for receiving said control output signal from said operator-actuated control means, and in response to said first data set, causing said memory means to store any of said marker/order bits associated with one of said channel tuning designations corresponding to the respective place of said channel tuning designation within said cue, and in response to said second data set, reviewing said cue to determine a next in order of said channel tuning designations to have one of said marker/order bits associated therewith, and generating said processor signal to correspond to said next channel tuning designation.*

*20. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing a marker value for at least one of said channel tuning designations, and means for retaining said channel tuning designations in a plurality of ordered cues;*

*operator-actuated control means for generating a control output signal comprising one of (a) a first data set representative of the presence of said marker value associated with one of said channel tuning designations and one of said cues, and (b) a second data set representative of a command to advance to a subsequent channel tuning designation within a selected one of said cues;*

*processor means for receiving said control output signal from said operator-actuated control means, and in response to said first data set, causing said memory means to store any of said marker values associated with one of said channel tuning designations, and in response to said second data set, reviewing the corresponding one of said cues to determine a next of said channel tuning designations to have one of said marker values associated therewith which corresponds to said cue, and generating said processor signal to correspond to said next channel tuning designation.*

*21. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and in response to said first data set, causing said memory means to store said desired channel select designation as corresponding to said one channel tuning designation, and in response to said second data set, retrieving from said memory means the one of said channel tuning designations corresponding to said operator selected channel select designation, and generating said channel tuning control signal to correspond to said one channel tuning designation;*

*wherein said memory means includes means for storing a marker value for each of said channel select designations, and means for retaining said channel select designations in a plurality of ordered cues;*

*said control means including means for generating, at the selection of the operator, a part of said first data set representative of the presence of said marker value associated with one of said channel select designations and one of said cues, and means for generating a third data set representative of a command to advance to a subsequent channel select designation within a selected one of said cues;*

*said processor means, in response to said first data set, causing said memory means to store any of said marker values associated with one of said channel select designations, and in response to said third data set, reviewing the corresponding one of said cues to determine a next of said channel select designations to have one of said marker values associated therewith which corresponds to said cue, and generating said processor signal to correspond to said next channel select designation.*

*22. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and in response to said first data set, causing said memory means to store said desired channel select designation as corresponding to said one channel tuning designation, and in response to said second data set, retrieving from said memory means the one of said channel tuning designations corresponding to said operator selected channel select designation, and generating said channel tuning control signal to correspond to said one channel tuning designation;*

*wherein said memory means includes means for initially storing a channel select designation for each of said channel tuning designations which is identical thereto;*

*said operator-actuated control means including means for generating a memory clear signal;*

*said processor means including means for receiving said memory clear signal, and in response thereto, clearing said memory and restoring therein said channel select designation for each of said channel tuning designations which is identical thereto.*

*23. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*first operator-actuated control means for generating a first control output signal comprising a first data set representative of a desired channel select designation for one of said channel tuning designations;*

*second operator-actuated control means distinct and remotely located from said first operator-actuated control means for generating a second control output signal comprising a second data set representative of a desired viewing channel identified by an operator selected one of said channel select designations:*

*processor means for receiving said first and second control output signals from said first and second operator-actuated control means, and in response to said first data set, causing said memory means to store said desired channel select designation as corresponding to said one channel tuning designation, and in response to said second data set, retrieving from said memory means the one of said channel tuning designations corresponding to said operator selected channel select designation, and generating said channel tuning control signal to correspond to said one channel tuning designation.*

*24. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*first operator-actuated control means for generating a first control output signal comprising a first data set representative of a desired channel select designation for one of said channel tuning designations;*

*means for receiving said first data set and causing said memory means to store said desired channel select designation as corresponding to said one channel tuning designation;*

*second operator-actuated control means distinct and remotely located from said first operator-actuated control means for generating a second control output signal comprising a second data set representative of a desired viewing channel identified by an operator selected one of said channel select designations;*

*processor means for receiving said second control output signal from said second operator-actuated control means, and in response thereto, retrieving from said memory means the one of said channel tuning designations corresponding to said operator selected channel select designation, and generating said channel tuning control signal to correspond to said one channel tuning designation.*

*25. A system for controlling a television receiver capable of tuning from a multi-channel input a television channel corresponding to a preassigned channel tuning designation in response to a channel tuning control signal, the system comprising:*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and in response to said first data set, causing said memory means to store said desired channel select designation as corresponding to said one channel tuning designation, and in response to said second data set, retrieving from said memory means the one of said channel tuning designations corresponding to said operator selected channel select designation, and generating said channel tuning control signal to correspond to said one channel tuning designation;*

*wherein said memory means includes means for storing more than one of said channel select designations corresponding to a single one of said channel tuning designations.*

*26. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker bit for at least one of said channel tuning designations, for retaining said channel tuning designations in an ordered cue;*

*operator-actuated control means for generating a control output signal comprising one of (a) a first data set representative of the presence of said marker bit associated with one of said channel tuning designations, and (b) a second data set representative of a command to advance to a subsequent channel tuning designation within said cue;*

*processor means for receiving said control output signal from said operator-actuated control means, and in response to said first data set, causing said memory means to store any of said marker bits associated with one of said channel tuning designations corresponding to the respective place of said channel tuning designation within said cue, and in response to said second data set, reviewing said cue to determine a next in order of said channel tuning designations to have one of said marker bits associated therewith, and generating said processor signal to correspond to said next channel tuning designation;*

*said memory means including means for storing at least one order bit for each of said channel tuning designations which have one of said marker bits associated therewith which comprises said means for retaining said channel tuning designations in said ordered cue;*

*said processor means, in response to said first data set, causing said memory means to store an order bit associated with said channel tuning designation which has one of said marker bits associated therewith corresponding to the respective place of said channel tuning designation within said cue, and in response to said third data signal, determining said next of said channel tuning designations which have one of said marker bits associated therewith by reviewing said order bits.*

*27. A system for controlling a television receiver capable of tuning from a multi-channel input a television channel corresponding to a preassigned channel tuning designation in response to a channel tuning control signal, the system comprising:*

*a memory adapted to store at least one operator-assigned channel select designation for at least one of said channel tuning designations;*

*an operator-actuated control device for generating a control output signal comprising one of (a) a first data set representative of a desired channel select designation for one of said channel tuning designations, and (b) a second data set representative of a desired viewing channel identified by an operator selected one of said channel select designations;*

*a processor that receives said control output signal from said operator-actuated control device, and in response to said first data set, causes said memory to store said desired channel select designation as corresponding to said one channel tuning designation, and in response to said second data set, retrieves from said memory the one of said channel tuning designations corresponding to said operator selected channel select designation, and generates said channel tuning control signal to correspond to said one channel tuning designation;*

*said memory further being adapted to initially store a channel select designation for at least one of said channel tuning designations which is identical thereto.*

*28. In a television control system apparatus for selecting a television channel corresponding to a preassigned channel tuning designation, the system apparatus comprising:*

*a tuner for receiving a processor signal and a multi-channel input signal, and in response to said processor signal, tuning out all but one channel corresponding to a selected one of said preassigned channel tuning designations;*

*a memory adapted to store at least one marker/order bit for at least one of said channel tuning designations, for retaining said channel tuning designations in an ordered cue;*

*an operator-actuated control device for generating a control output signal comprising one of (a) a first data set representative of the presence of said marker/order bit associated with one of said channel tuning designations, and (b) a second data set representative of a command to advance to a subsequent channel tuning designation within said cue;*

*a processor that receives said control output signal from said operator-actuated control device, and in response to said first data set, causes said memory means to store any of said marker/order bits associated with one of said channel tuning designations corresponding to the respective place of said channel tuning designation within said cue, and in response to said second data set, reviews said cue to determine a next in order of said channel tuning designations to have one of said marker/order bits associated therewith, and generates said processor signal to correspond to said next channel tuning designation.*

*29. In a television control system apparatus for selecting a television channel corresponding to a preassigned channel tuning designation, the system apparatus comprising:*

*a tuner for receiving said multi-channel input signal and tuning out all but one channel corresponding to a selected one of said preassigned channel tuning designations;*

*a memory adapted to store a marker value for at least one of said channel tuning designations, and for retaining said channel tuning designations in a plurality of ordered cues;*

*an operator-actuated control device for generating a control output signal comprising one of (a) a first data set representative of the presence of said marker value associated with one of said channel tuning designations and one of said cues, and (b) a second data set representative of a command to advance to a subsequent channel tuning designation within a selected one of said cues;*

*a processor that receives said control output signal from said operator-actuated control device, and upon receipt of said first data set, causes said memory to store any of said marker values associated with one of said channel tuning designations, and upon receipt of said second data set, reviews the corresponding one of said cues to determine a next of said channel tuning designations to have one of said marker values associated therewith which corresponds to said cue, and generating said processor signal to correspond to said next channel tuning designation.*

*30. A system for controlling a television receiver capable of tuning from a multi-channel input a television channel corresponding to a preassigned channel tuning designation in response to a channel tuning control signal, the system comprising:*

*a memory adapted to store at least one operator-assigned channel select designation for at least one of said channel tuning designations;*

*an operator-actuated control device for generating a control output signal comprising one of (a) a first data*

*set representative of a desired channel select designation for one of said channel tuning designations, and (b) a second data set representative of a desired viewing channel identified by an operator selected one of said channel select designations;*

*a processor that receives said control output signal from said operator-actuated control device, and in response to said first data set, causes said memory to store said desired channel select designation as corresponding to said one channel tuning designation, and in response to said second data set, retrieves from said memory the one of said channel tuning designations corresponding to said operator selected channel select designation, and generates said channel tuning control signal to correspond to said one channel tuning designation;*

*wherein said memory further stores a marker value for each of said channel select designations, and retains said channel select designations in a plurality of ordered cues;*

*said control device further generating, at the selection of the operator, a part of said first data set representative of the presence of said marker value associated with one of said channel select designations and one of said cues, and generating a third data set representative of a command to advance to a subsequent channel select designation within a selected one of said cues;*

*said processor, in response to said first data set, causes said memory to store any of said marker values associated with one of said channel select designations, and in response to said third data set, reviews the corresponding one of said cues to determine a next of said channel select designations to have one of said marker values associated therewith which corresponds to said cue, and generates said processor signal to correspond to said next channel select designation.*

*31. A system for controlling a television receiver capable of tuning from a multi-channel input a television channel corresponding to a preassigned channel tuning designation in response to a channel tuning control signal, the system comprising:*

*a memory adapted to store at least one operator-assigned channel select designation for at least one of said channel tuning designations;*

*an operator-actuated control device for generating a control output signal comprising one of (a) a first data set representative of a desired channel select designation for one of said channel tuning designations, and (b) a second data set representative of a desired viewing channel identified by an operator selected one of said channel select designations;*

*a processor that receives said control output signal from said operator-actuated control device, and in response to said first data set, causes said memory to store said desired channel select designation as corresponding to said one channel tuning designation, and in response to said second data set, retrieves from said memory the one of said channel tuning designations corresponding to said operator selected channel select designation, and generates said channel tuning control signal to correspond to said one channel tuning designation;*

*wherein said memory is adapted to initially store a channel select designation for each of said channel tuning designations which is identical thereto;*

*said operator-actuated control device being adapted to generate a memory clear signal;*

*wherein said processor receives said memory clear signal, and in response thereto, clears said memory and restores therein said channel select designation for each of said channel tuning designations which is identical thereto.*

*32. A system for controlling a television receiver capable of tuning from a multi-channel input a television channel corresponding to a preassigned channel tuning designation in response to a channel tuning control signal, the system comprising:*

*a memory adapted to store at least one operator-assigned channel select designation for at least one of said channel tuning designations;*

*a first operator-actuated control device for generating a first control output signal comprising a first data set representative of a desired channel select designation for one of said channel tuning designations;*

*a second operator-actuated control device distinct and remotely located from said first operator-actuated control means for generating a second control output signal comprising a second data set representative of a desired viewing channel identified by an operator selected one of said channel select designations;*

*a processor that receives said first and second control output signals from said first and second operator-actuated control devices, and in response to said first data set, causes said memory to store said desired channel select designation as corresponding to said one channel tuning designation, and in response to said second data set, retrieves from said memory the one of said channel tuning designations corresponding to said operator selected channel select designation, and generates said channel tuning control signal to correspond to said one channel tuning designation.*

*33. A system for controlling a television receiver capable of tuning from a multi-channel input a television channel corresponding to a preassigned channel tuning designation in response to a channel tuning control signal, the system comprising:*

*a memory adapted to store at least one operator-assigned channel select designation for at least one of said channel tuning designations;*

*an operator-actuated control device for generating a control output signal comprising one of (a) a first data set representative of a desired channel select designation for one of said channel tuning designations, and (b) a second data set representative of a desired viewing channel identified by an operator selected one of said channel select designations;*

*a processor that receives said control output signal from said operator-actuated control device, and in response to said first data set, causes said memory to store said desired channel select designation as corresponding to said one channel tuning designation, and in response to said second data set, retrieves from said memory the one of said channel tuning designations corresponding to said operator selected channel select designation, and generates said channel tuning control signal to correspond to said one channel tuning designation;*

*wherein said memory is adapted to store more than one of said channel select designations corresponding to a single one of said channel tuning designations.*

*34. In a television control system apparatus for selecting a television channel corresponding to a preassigned channel tuning designation, the system apparatus comprising:*

*a tuner for receiving a processor signal and a multi-channel input signal, and in response to said processor signal, tuning out all but one channel corresponding to a selected one of said preassigned channel tuning designations;*

*a memory adapted to store at least one marker/order bit for at least one of said channel tuning designations, for retaining said channel tuning designations in an ordered cue;*

*an operator-actuated control device for generating a control output signal comprising one of (a) a first data set representative of the presence of said marker/order bit associated with one of said channel tuning designations, and (b) a second data set representative of a command to advance to a subsequent channel tuning designation within said cue;*

*a processor that receives said control output signal from said operator-actuated control device, and in response to said first data set, causes said memory to store any of said marker/order bits associated with one of said channel tuning designations corresponding to the respective place of said channel tuning designation within said cue, and in response to said second data set, reviews said cue to determine a next in order of said channel tuning designations to have one of said marker/order bits associated therewith, and generates said processor signal to correspond to said next channel tuning designation;*

*said memory being adapted to store at least one order bit for each of said channel tuning designations which have one of said marker bits associated therewith which retains said channel tuning designations in said ordered cue;*

*wherein said processor, in response to said first data set, causes said memory to store an order bit associated with said channel tuning designation which has one of said marker bits associated therewith corresponding to the respective place of said channel tuning designation within said cue, and in response to said third data signal, determines said next of said channel tuning designations which have one of said marker bits associated therewith by reviewing said order bits.*

*35. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one operator-assigned channel select designation for each of a plurality of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*

*wherein said memory means includes means for initially storing a channel select designation for each of said plurality of said channel tuning designations which is identical thereto;*

*said operator-actuated control means including means for generating a memory clear signal;*

*said processor means including means for receiving said memory clear signal, and in response thereto, clearing from said memory a selected one of said channel select designations and restoring therein said channel select designation for a corresponding one of said channel tuning designations which is identical thereto.*

*36. A system for controlling a television receiver capable of tuning from a multi-channel input a television channel corresponding to a preassigned channel tuning designation upon receipt of a channel tuning control signal, the system comprising:*

*memory means for storing at least one operator-assigned channel select designation for each of a plurality of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said channel tuning control signal to correspond to said one channel tuning designation;*

*wherein said memory means includes means for initially storing a channel select designation for each of said plurality of said channel tuning designations which is identical thereto;*

*said operator-actuated control means including means for generating a memory clear signal:*

*said processor means including means for receiving said memory clear signal, and in response thereto, clearing from said memory a selected one of said channel select designations and restoring therein said channel select designation for a corresponding one of said channel tuning designations which is identical thereto.*

*37. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing a marker value for at least one of said channel tuning designations, and means for retaining said channel tuning designations in a plurality of scroll sequences;*

*operator-actuated control means for generating a control output signal comprising one of (a) a first data set representative of the presence of said marker value*

*associated with one of said channel tuning designations and one of said scroll sequences, and (b) a second data set representative of a command to advance to a subsequent channel tuning designation within a selected one of said scroll sequences;*

*processor means for receiving said control output signal from said operator-actuated control means, and upon receipt of said first data set, causing said memory means to store any of said marker values associated with one of said channel tuning designations, and upon receipt of said second data set, reviewing the corresponding one of said scroll sequences to determine a next of said channel tuning designations to have one of said marker values associated therewith which corresponds to said scroll sequence, and generating said processor signal to correspond to said next channel tuning designation.*

*38. A television control apparatus as defined in claim 37, wherein said control means further includes means for generating a scroll sequence selection signal corresponding to one of said scroll sequences, and wherein said processor means, upon receipt of said scroll sequence selection signal reviews the one of said scroll sequences corresponding thereto.*

*39. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker/order bit for at least one of said channel tuning designations, for retaining said channel tuning designations in an ordered scroll sequence;*

*operator-actuated control means for generating a control output signal comprising one of (a) a first data set representative of the presence of said marker/order bit associated with one of said channel tuning designations, and (b) a second data set representative of a command to advance to a subsequent channel tuning designation within said scroll sequence;*

*processor means for receiving said control output signal from said operator-actuated control means, and upon receipt of said first data set, causing said memory means to store any of said marker/order bits associated with one of said channel tuning designations corresponding to the respective place of said channel tuning designation within said scroll sequence, and upon receipt of said second data set, reviewing said scroll sequence to determine a next in order of said channel tuning designations to have one of said marker/order bits associated therewith, and generating said processor signal to correspond to said next channel tuning designation;*

*said memory means including means for storing at least one order bit for each of said channel tuning designations which have one of said marker bits associated therewith which comprises said means for retaining said channel tuning designations in said ordered scroll sequence;*

*said processor means, upon receipt of said first data set, causing said memory means to store an order bit associated with said channel tuning designation which has one of said marker bits associated therewith corresponding to the respective place of said channel tuning designation within said scroll sequence, and upon receipt of said third data signal, determining said next of said channel tuning designations which have one of said marker bits associated therewith by reviewing said order bits.*

*40. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one marker/order bit for at least one of said channel tuning designations, for retaining said channel tuning designations in an ordered scroll sequence;*

*operator-actuated control means for generating a control output signal comprising one of (a) a first data set representative of the presence of said marker/order bit associated with one of said channel tuning designations, and (b) a second data set representative of a command to advance to a subsequent channel tuning designation within said scroll sequence;*

*processor means for receiving said control output signal from said operator-actuated control means, and in response to said first data set, causing said memory means to store any of said marker/order bits associated with one of said channel tuning designations corresponding to the respective place of said channel tuning designation within said scroll sequence, and in response to said second data set, reviewing said scroll sequence to determine a next in order of said channel tuning designations to have one of said marker/order bits associated therewith, and generating said processor signal to correspond to said next channel tuning designation;*

*said memory means including means for storing at least one order bit for each of said channel tuning designations which have one of said marker bits associated therewith which comprises said means for retaining said channel tuning designations in said ordered scroll sequence;*

*said processor means, in response to said first data set, causing said memory means to store an order bit associated with said channel tuning designation which has one of said marker bits associated therewith corresponding to the respective place of said channel tuning designation within said scroll sequence, and in response to said third data signal, determining said next of said channel tuning designations which have one of said marker bits associated therewith by reviewing said order bits.*

*41. In a television control system apparatus for selecting a television channel corresponding to a preassigned channel tuning designation, the system apparatus comprising:*

*tuner means for receiving a processor signal and a multi-channel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set*

*representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*

*wherein said memory means includes means for storing a marker value for each of said channel select designations, and means for retaining said channel select designations in a plurality of scroll sequences;*

*said control means including means for generating, at the selection of the operator, a part of said first data set representative of the presence of said marker value associated with one of said channel select designations and one of said scroll sequences, and means for generating a third data set representative of a command to advance to a subsequent channel select designation within a selected one of said scroll sequences;*

*said processor means, upon receipt of said first data set, causing said memory means to store any of said marker values associated with one of said channel select designations, and upon receipt of said third data set, reviewing the corresponding one of said scroll sequences to determine a next of said channel select designations to have one of said marker values associated therewith which corresponds to said scroll sequences, and generating said processor signal to correspond to said next channel select designation.*

*42. A television control system apparatus as defined in claim 8, wherein:*

*said memory means further includes means for storing at least one operator-assigned channel select designation for at least one of said channel tuning designations;*

*said control output signal further comprises one of (c) a third data set representative of a desired channel select designation for one of said channel tuning designations, and (d) a fourth data set representative of a desired viewing channel identified by an operator selected one of said channel select designations;*

*said processor means further, following receipt of said third data set, causing said memory means to store said desired channel select designation as corresponding to said one channel tuning designation, and following receipt of said fourth data set, retrieving from said memory means the one of said channel tuning designations corresponding to said operator selected channel select designation, and generating said processor signal to correspond to said one channel tuning designation.*

*43. A television control system apparatus as defined in claim 42, further comprising a display, and wherein:*

*said memory means further includes means for storing at least one operator-assigned display designation for at least one of said channel tuning designations;*

*said control output signal further comprises one of (e) a fifth data set representative of a desired display designation for one of said channel tuning designations;*

*said processor means further, following receipt of said fifth data set, causing said memory means to store said desired channel select designation as corresponding to said one channel tuning designation, and following receipt of said fourth data set, retrieving from said memory means the one of said display designations corresponding to said one channel tuning designation and causing said one display designation to be displayed on said display.*

*44. A television control system apparatus as defined in claim 8, further comprising a display, and wherein:*

*said memory means further includes means for storing at least one operator-assigned display designation for at least one of said channel tuning designations;*

*said control output signal further comprises one of (c) a third data set representative of a desired display designation for one of said channel tuning designations;*

*said processor means further, following receipt of said third data set, causing said memory means to store said desired channel select designation as corresponding to said one channel tuning designation, and further following receipt of said second data set, retrieving from said memory means the one of said display designations corresponding to said next channel tuning designation and causing said one display designation to be displayed on said display.*

*45. In a television control system apparatus for selecting a television channel corresponding to a preassigned channel tuning designation, the system apparatus comprising:*

*a television screen;*

*tuner means for receiving a processor signal and a multi-channel input signal, and in response to said processor signal, tuning out all but one channel corresponding to a selected one of said preassigned channel tuning designations;*

*memory means for storing at least one operator-assigned channel select designation for at least one of said channel tuning designations;*

*operator-actuated control means for generating a control output signal comprising one of (a) a first data set representative of a desired channel select designation for one of said channel tuning designations, and (b) a second data set representative of a desired viewing channel identified by an operator selected one of said channel select designations;*

*processor means for receiving said control output signal from said operator-actuated control means, and upon receipt of said first data set, causing said memory means to store said desired channel select designation as corresponding to said one channel tuning designation, and upon receipt of said second data set, retrieving from said memory means the one of said channel tuning designations corresponding to said operator selected channel select designation, and generating said processor signal to correspond to said one channel tuning designation;*

*wherein said memory means includes means for storing a marker value for each of said channel select designations, and means for retaining said channel select designations in a plurality of ordered cues;*

*said control means including means for generating, at the selection of the operator, a part of said first data set representative of the presence of said marker value associated with one of said channel select designations and one of said cues, and means for generating a third*

*data set representative of a command to advance to a subsequent channel select designation within a selected one of said cues;*

*said processor means, upon receipt of said first data set, causing said memory means to store any of said marker values associated with one of said channel select designations, and upon receipt of said third data set, reviewing the corresponding one of said cues to determine a next of said channel select designations to have one of said marker values associated therewith which corresponds to said cue, and generating said processor signal to correspond to said next channel select designation whereby a selected television channel is displayed on said screen.*

*46. A system for controlling a television receiver capable of tuning from a multi-channel input a television channel corresponding to a preassigned channel code in response to a channel tuning control signal, the system comprising:*

*memory means for storing at least one operator-assigned select code for at least one of said channel codes;*

*operator-actuated control means for generating a control output signal including a string of two or more label characters and comprising one of (a) a first data set representative at least in part of a desired select code for one of said channel codes, and (b) a second data set having as an initial character one of said label characters and representative of a desired viewing channel identified by an operator selected one of said select codes;*

*processor means for receiving said control output signal from said operator-actuated control means, and in response to said first data set, causing said memory means to store said desired select code as corresponding to said one channel code, and in response to solely said second data set, retrieving from said memory means the one of said channel codes corresponding to said operator selected select code, and generating said channel tuning control signal to correspond to said one channel code.*

*47. A system for controlling a television receiver capable of tuning from a multi-channel input a television channel corresponding to a preassigned channel code in response to a channel tuning control signal, the system comprising:*

*memory means for storing at least one operator-assigned select code for at least one of said channel codes;*

*operator-actuated control means for generating a control output signal comprising one of (a) a first data set representative of a desired select code for one of said channel codes, and (b) a second data set representative of a desired viewing channel identified by an operator selected one of said select codes;*

*processor means for receiving said control output signal from said operator-actuated control means, and in response to said first data set, causing said memory means to store said desired select code as corresponding to said one channel code, and in response to said second data set, retrieving from said memory means the one of said channel codes corresponding to said operator selected select code, and generating said channel tuning control signal to correspond to said one channel code;*

*said memory means including means for initially storing a select code for at least one of said channel codes which is identical thereto.*

*48. A system for controlling a television receiver capable of tuning from a multi-channel input a television channel corresponding to a preassigned channel code in response to a channel tuning control signal, the system comprising:*

*memory means for storing at least one operator-assigned select code for at least one of said channel codes;*

*first operator-actuated control means for generating a first control output signal comprising a first data set representative of a desired select code for one of said channel codes;*

*second operator-actuated control means for generating a second control output signal comprising a second data set representative of a desired viewing channel identified by an operator selected one of said select codes;*

*processor means for receiving said first and second control output signals from said first and second operator-actuated control means, and in response to said first data set, causing said memory means to store said desired select code as corresponding to said one channel code, and in response to said second data set, retrieving from said memory means the one of said channel codes corresponding to said operator selected select code, and generating said channel tuning control signal to correspond to said one channel code.*

*49. A system for controlling a television receiver capable of tuning from a multi-channel input a television channel corresponding to a preassigned channel code in response to a channel tuning control signal, the system comprising:*

*memory means for storing at least one operator-assigned select code for at least one of said channel codes;*

*operator-actuated control means for generating a control output signal comprising one of (a) a first data set representative of a desired select code for one of said channel codes, and (b) a second data set representative of a desired viewing channel identified by an operator selected one of said select codes;*

*processor means for receiving said control output signal from said operator-actuated control means, and in response to said first data set, causing said memory means to store said desired select code as corresponding to said one channel code, and in response to said second data set, retrieving from said memory means the one of said channel codes corresponding to said operator selected select code, and generating said channel tuning control signal to correspond to said one channel code;*

*wherein said memory means includes means for storing more than one of said select codes corresponding to a single one of said channel codes.*

*50. A system for controlling a television receiver capable of tuning from a multi-channel input a television channel corresponding to a preassigned channel tuning designation in response to a channel tuning control signal, the system comprising:*

*memory means for storing a plurality of said channel tuning designations within a first series, and for storing within a second series a plurality of operator-assigned channel select designations wherein each of said channel select designations within said second series corresponds to one of said channel tuning designations within said first series;*

*operator-actuated control means for generating a control output signal comprising one of (a) a first data set representative at least in part of a desired channel select designation for one of said channel tuning designations, and (b) a second data set representative of a desired viewing channel identified by an operator selected one of said channel select designations;*

*processor means for receiving said control output signal from said operator-actuated control means, and in response to said first data set, causing said memory means to store said desired channel select designation within said second series as corresponding to said one channel tuning designation within said first series, and in response to said second data set, retrieving from said first series the one of said channel tuning designations corresponding to said operator selected channel select designation, and generating said channel tuning control signal to correspond to said one channel tuning designation.*

*51. A television control system as defined in claim 50, further comprising a display, and wherein:*

*said memory means further includes means for storing within a third series an operator-assigned display designation corresponding to at least one of said channel tuning designations within said first series;*

*said control output signal further comprises one of (c) a third data set representative of a desired display designation for one of said channel tuning designations;*

*said processor means further, following receipt of said third data set, causing said memory means to store said desired channel select designation within said third series as corresponding to said one channel tuning designation, and further following receipt of said second data set, retrieving from said third series the one of said display designations corresponding to said next channel tuning designation and causing said one display designation to be displayed on said display.*

*52. The method of claim 5, wherein said step of generating said first control output signal is performed by a first person, and wherein said step of generating said second control output signal is performed by a second person.*

*53. The method of claim 5, wherein said step of generating said first control output signal is performed by a first person, and wherein said desired channel select designation is predetermined by a second person.*

* * * * *

US00RE35952C1

(12) EX PARTE REEXAMINATION CERTIFICATE (10126th)

United States Patent
Beery

(10) Number: US RE35,952 C1
(45) Certificate Issued: Apr. 22, 2014

(54) TELEVISION RECEIVER HAVING MEMORY CONTROL FOR TUNE-BY-LABEL FEATURE

(75) Inventor: Jack Beery, Washington, DC (US)

(73) Assignee: Technology Development & Licensing, LLC, Henderson, NV (US)

Reexamination Request:
No. 90/009,400, Feb. 9, 2009
No. 90/009,456, May 27, 2009
No. 90/010,726, Oct. 30, 2009

Reexamination Certificate for:

| | |
|---|---|
| Patent No.: | **Re. 35,952** |
| Issued: | **Nov. 10, 1998** |
| Appl. No.: | **08/116,019** |
| Filed: | **Sep. 2, 1993** |

Related U.S. Patent Documents

Reissue of:

| | |
|---|---|
| (64) Patent No.: | **5,045,947** |
| Issued: | **Sep. 3, 1991** |
| Appl. No.: | **07/514,693** |
| Filed: | **Apr. 26, 1990** |

Related U.S. Application Data

(63) Continuation-in-part of application No. 07/359,155, filed on May 31, 1989, now Pat. No. 5,068,734.

(51) Int. Cl.
*H04N 5/50* (2006.01)

(52) U.S. Cl.
USPC ..... 348/731; 348/570; 348/734

(58) Field of Classification Search
None
See application file for complete search history.

(56) References Cited

To view the complete listing of prior art documents cited during the proceedings for Reexamination Control Numbers 90/009,400, 90/009,456, and 90/010,726, please refer to the USPTO's public Patent Application Information Retrieval (PAIR) system under the Display References tab.

*Primary Examiner* — Joseph R. Pokrzywa

(57) ABSTRACT

A television control system is for selecting a television channel corresponding to a preassigned channel tuning designation. A tuner receives multi-channel input signal, and in response to a processor signal, tunes out all but one selected channel. A memory stores at least one operator-assigned channel select designation for the channel tuning designations. An operator-actuated control means generates a first data signal representative of a desired channel select designation for one of the channel tuning designations, and a second data signal representative of a desired viewing channel identified by one of the channel select designations. A processor receives the first data signal from the control means, and in response, causes the memory to store the desired channel select designation as corresponding to the tuning designation. Upon receipt of the second data signal, the processor retrieves from the memory the channel tuning designation corresponding to the channel select designation, and generates the processor signal to correspond to the channel tuning designation.

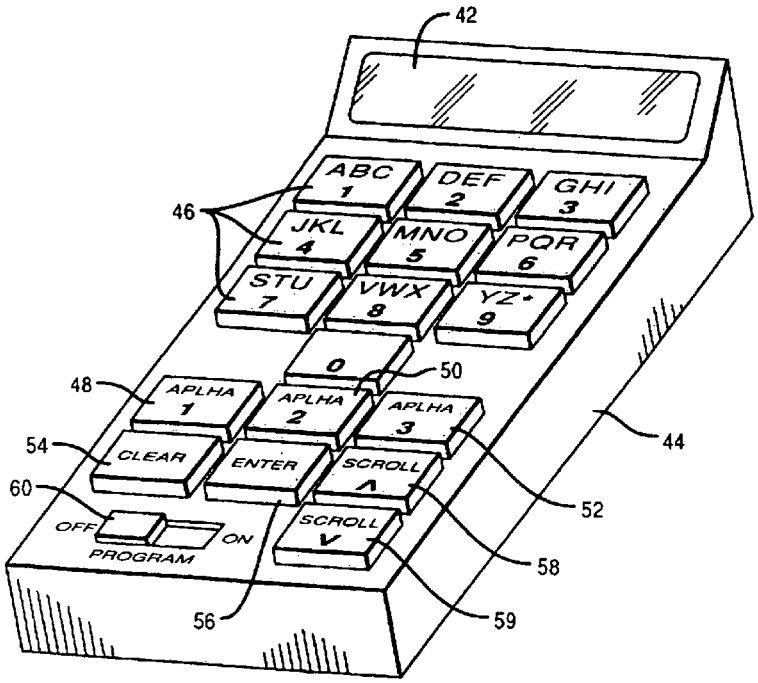

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 1-4, 8, 9, 37, 38 and 42-44 is confirmed.

Claims 5-7, 10-36, 39-41 and 45-53 are cancelled.

* * * * *

US00RE35952C2

(12) EX PARTE REEXAMINATION CERTIFICATE (10642nd)

United States Patent
Beery

(10) Number: US RE35,952 C2
(45) Certificate Issued: Jun. 24, 2015

(54) TELEVISION RECEIVER HAVING MEMORY CONTROL FOR TUNE-BY-LABEL FEATURE

(75) Inventor: Jack Beery, Washington, DC (US)

(73) Assignee: TECHNOLOGY DEVELOPMENT & LICENSING, LLC, Henderson, NV (US)

Reexamination Request:
No. 90/013,219, Apr. 23, 2014

Reexamination Certificate for:

| | |
|---|---|
| Patent No.: | **Re. 35,952** |
| Issued: | **Nov. 10, 1998** |
| Appl. No.: | **08/116,019** |
| Filed: | **Sep. 2, 1993** |

Reexamination Certificate C1 Re. 35,952 issued Apr. 22, 2014

Related U.S. Patent Documents

Reissue of:

| | |
|---|---|
| (64) Patent No.: | **5,045,947** |
| Issued: | **Sep. 3, 1991** |
| Appl. No.: | **07/514,693** |
| Filed: | **Apr. 26, 1990** |

Related U.S. Application Data

(63) Continuation-in-part of application No. 07/359,155, filed on May 31, 1989, now Pat. No. 5,068,734.

(51) Int. Cl.
*H04N 5/50* (2006.01)
*H04N 21/40* (2011.01)

(52) U.S. Cl.
CPC ..... *H04N 21/40* (2013.01)

(58) Field of Classification Search
None
See application file for complete search history.

(56) References Cited

To view the complete listing of prior art documents cited during the proceeding for Reexamination Control Number 90/013,219, please refer to the USPTO's public Patent Application Information Retrieval (PAIR) system under the Display References tab.

*Primary Examiner* — Eron J Sorrell

(57) ABSTRACT

A television control system is for selecting as television channel corresponding to a preassigned channel tuning designation. A tuner receives multi-channel input signal, and in response to a processor signal, tunes out all but one selected channel. A memory stores at least one operator-assigned channel select designation for the channel tuning designations. An operator-actuated control means generates a first data signal representative of a desired channel select designation for one of the channel tuning designations, and a second data signal representative of a desired viewing channel identified by one of the channel select designations. A processor receives the first data signal from the control means, and in response, causes the memory to store the desired channel select designation as corresponding to the tuning designation. Upon receipt of the second data signal, the processor retrieves from the memory the channel tuning designation corresponding to the channel select designation, and generates the processor signal to correspond to the channel tuning designation.

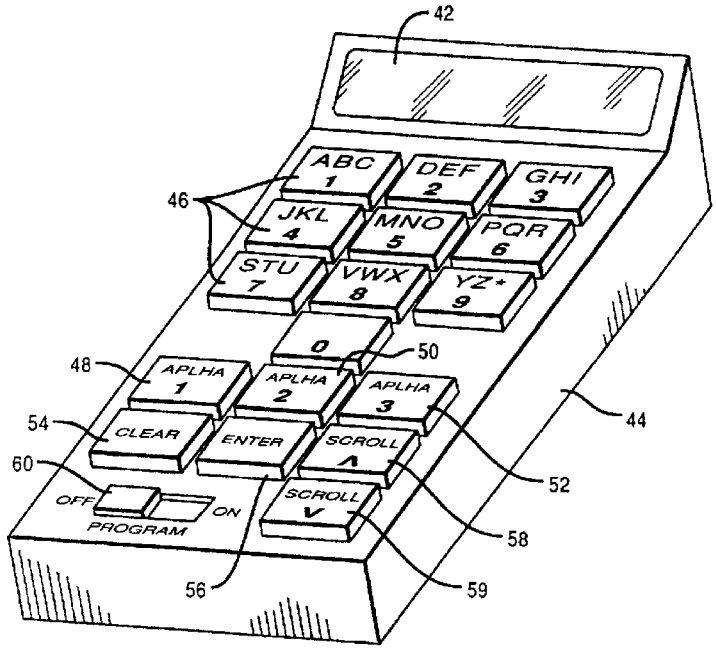

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1, 2, 8, 9, 37, 38 and 42-44 is confirmed.

Claims 5-7, 10-36, 39-41 and 45-53 were previously cancelled.

Claims 3 and 4 were not reexamined.

* * * * *